(12) United States Patent
Shin et al.

(10) Patent No.: US 11,742,221 B2
(45) Date of Patent: Aug. 29, 2023

(54) DRY CLEANING APPARATUS AND DRY CLEANING METHOD

(71) Applicant: Samsung Electronics Co., Ltd., Suwon-si (KR)

(72) Inventors: Seung-Min Shin, Daejeon (KR); Seok-Hoon Kim, Seongnam-si (KR); Young-Hoo Kim, Yongin-si (KR); In-Gi Kim, Hwaseong-si (KR); Tae-Hong Kim, Seoul (KR); Sung-Hyun Park, Daegu (KR); Jin-Woo Lee, Yongin-si (KR); Ji-Hoon Cha, Seoul (KR); Yong-Jun Choi, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 62 days.

(21) Appl. No.: 17/376,369

(22) Filed: Jul. 15, 2021

(65) Prior Publication Data
US 2021/0343552 A1 Nov. 4, 2021

Related U.S. Application Data

(63) Continuation of application No. 16/371,461, filed on Apr. 1, 2019, now Pat. No. 11,087,996.

(30) Foreign Application Priority Data

Sep. 10, 2018 (KR) ........................ 10-2018-0107944

(51) Int. Cl.
*H01L 21/67* (2006.01)
*H01L 21/02* (2006.01)
(Continued)

(52) U.S. Cl.
CPC ...... *H01L 21/67034* (2013.01); *B08B 7/0042* (2013.01); *B23K 26/352* (2015.10);
(Continued)

(58) Field of Classification Search
None
See application file for complete search history.

(56) References Cited

U.S. PATENT DOCUMENTS 6,329,297 B1 * 12/2001 Balish ................. H01J 37/3244
156/345.35
6,635,845 B2 10/2003 Lee et al.
(Continued)

FOREIGN PATENT DOCUMENTS

KR 1020040079563 A 9/2004

OTHER PUBLICATIONS

Office Action dated Jun. 23, 2023 from the Korean Intellectual Property Office (KIPO) for Korean Patent Application No. 10-2018-0107944.
(Continued)

*Primary Examiner* — Cristi J Tate-Sims
(74) *Attorney, Agent, or Firm* — Muir Patent Law, PLLC

(57) ABSTRACT

A dry cleaning apparatus includes a chamber, a substrate support supporting a substrate within the chamber, a shower head arranged in an upper portion of the chamber to supply a dry cleaning gas toward the substrate, the shower head including an optical window transmitting a laser light therethrough toward the substrate support, a plasma generator generating plasma from the dry cleaning gas, and a laser irradiator irradiating the laser light on the substrate through the optical window and the plasma to heat the substrate.

7 Claims, 29 Drawing Sheets

(51) Int. Cl.
  *H01J 37/32*    (2006.01)
  *G02B 27/09*    (2006.01)
  *B23K 26/352*   (2014.01)
  *B08B 7/00*     (2006.01)
  *H01L 29/66*    (2006.01)
  *H10B 41/27*    (2023.01)
  *H10B 43/27*    (2023.01)

(52) U.S. Cl.
  CPC ...... *G02B 27/0955* (2013.01); *H01J 37/3244* (2013.01); *H01J 37/32568* (2013.01); *H01L 21/02098* (2013.01); *H01J 2237/335* (2013.01); *H01L 29/66545* (2013.01); *H01L 29/66795* (2013.01); *H10B 41/27* (2023.02); *H10B 43/27* (2023.02)

(56) References Cited

U.S. PATENT DOCUMENTS

| | | | |
|---|---|---|---|
| 6,758,941 B1 * | 7/2004 | Ookawa | H01J 37/32935 156/345.43 |
| 6,977,184 B1 * | 12/2005 | Chou | H01J 37/3244 257/E21.252 |
| 7,540,923 B2 | 6/2009 | Takagi et al. | |
| 8,038,835 B2 | 10/2011 | Hayashi et al. | |
| 8,173,934 B2 | 5/2012 | Lee et al. | |
| 8,506,718 B2 | 8/2013 | Shindou et al. | |
| 2001/0036741 A1 | 11/2001 | Tanaka et al. | |
| 2005/0032283 A1 * | 2/2005 | Itoga | H01L 21/02488 438/149 |
| 2008/0296258 A1 | 12/2008 | Elliott et al. | |
| 2010/0192973 A1 * | 8/2010 | Ueno | G02B 19/0052 134/1.1 |
| 2015/0244908 A1 | 8/2015 | Laroia et al. | |
| 2016/0071745 A1 | 3/2016 | Kim et al. | |
| 2017/0084426 A1 * | 3/2017 | Albarede | H01J 37/32715 |
| 2017/0326688 A1 | 11/2017 | Turner et al. | |

OTHER PUBLICATIONS

Office Action dated Mar. 22, 2023 from the Korean Intellectual Property Office (KIPO) for Korean Patent Application No. 10-2018-0107944.

* cited by examiner

DRY CLEANING APPARATUS AND DRY CLEANING METHOD

PRIORITY STATEMENT

This application is a continuation of and claims priority to U.S. patent application Ser. No. 16/371,461 filed on Apr. 1, 2019, which claims priority under 35 U.S.C. § 119 to Korean Patent Application No. 10-2018-0107944, filed on Sep. 10, 2018 in the Korean Intellectual Property Office (KIPO), the contents of each of which are herein incorporated by reference in their entirety.

BACKGROUND

1. Field

Example embodiments relate to a dry cleaning apparatus and a dry cleaning method. More particularly, example embodiments relate to a dry cleaning apparatus for performing a dry cleaning process using a dry cleaning gas in plasma state and a dry cleaning method using the same.

2. Description of the Related Art

A dry cleaning process may remove completely a target material even though miniaturization and an aspect ratio of a pattern are increased. However, a chemical reaction rate of a dry cleaning gas in vapor phase state or gas phase state may be reduced under room temperature, thereby reducing productivity.

SUMMARY

According to an exemplary embodiment of the present inventive concept, a dry cleaning apparatus includes a chamber, a substrate support supporting a substrate within the chamber, a shower head arranged in an upper portion of the chamber to supply a dry cleaning gas toward the substrate, the shower head including an optical window transmitting a laser light therethrough toward the substrate support, a plasma generator generating plasma from the dry cleaning gas, and a laser irradiator irradiating the laser light on the substrate through the optical window to heat the substrate.

According to an exemplary embodiment of the present inventive concept, a dry cleaning apparatus includes a chamber having an optical window and being supplied with a dry cleaning gas, a substrate support supporting a substrate within the chamber, a shower head arranged in an upper portion of the chamber to supply a dry cleaning gas toward the substrate, a plasma generator generating plasma from the dry cleaning gas, and a laser irradiator irradiating a laser light on the substrate through the optical window and the plasma to heat the substrate.

According to an exemplary embodiment of the present inventive concept, a dry cleaning method is provided as follows. A substrate is loaded into a chamber. A dry cleaning gas is supplied into the chamber through a shower head. Plasma is generated from the dry cleaning gas. A cleaning process by-product is formed by reacting the plasma with the etch residue. A laser light is irradiated on a surface of the substrate to heat the substrate, thereby transitioning the cleaning process by-product to a gaseous cleaning process by-product.

BRIEF DESCRIPTION OF THE DRAWINGS

Example embodiments will be more clearly understood from the following detailed description taken in conjunction with the accompanying drawings.

FIG. 1 is a block diagram illustrating a dry cleaning apparatus in accordance with example embodiments.

FIG. 2 is a plan view illustrating a showerhead of the dry cleaning apparatus in FIG. 1.

FIG. 3 is a cross-sectional view taken along the line A-A' in FIG. 2.

FIG. 4 is a view illustrating a laser irradiator of the dry cleaning apparatus in FIG. 1.

FIG. 5 is a view illustrating a laser light irradiated by the laser irradiator in FIG. 4.

FIG. 6 is a graph illustrating absorptivity of laser when the laser light is irradiated on a wafer by the laser irradiator in FIG. 4.

FIG. 7 is a block diagram illustrating a dry cleaning apparatus in accordance with example embodiments.

FIG. 8 is a cross-sectional view illustrating a shower head of the dry cleaning apparatus in FIG. 7.

FIG. 9 is a view illustrating a laser irradiator of a dry cleaning apparatus in accordance with example embodiments.

FIG. 10 is a plan view illustrating an optical mask of a laser irradiator in FIG. 9.

FIG. 11 is a perspective view illustrating a laser light irradiated on a wafer by the laser irradiator in FIG. 9.

FIG. 12 is a view illustrating an optical mask of a laser irradiator in accordance with example embodiments.

FIG. 13 is a perspective view illustrating a laser light irradiated on a wafer by the laser irradiator in FIG. 12.

FIG. 14 is a flow chart illustrating a dry cleaning method in accordance with example embodiments.

FIGS. 15 to 17 are cross-sectional views illustrating a method of forming a pattern of a semiconductor device in accordance with example embodiments.

FIGS. 18 to 27 are plan views and cross-sectional views illustrating stages of a method of manufacturing a semiconductor device in accordance with example embodiments.

FIGS. 28 to 34 are cross-sectional views illustrating a method of manufacturing a semiconductor device in accordance with example embodiments.

DETAILED DESCRIPTION

Hereinafter, example embodiments will be explained in detail with reference to the accompanying drawings.

Figure 1:
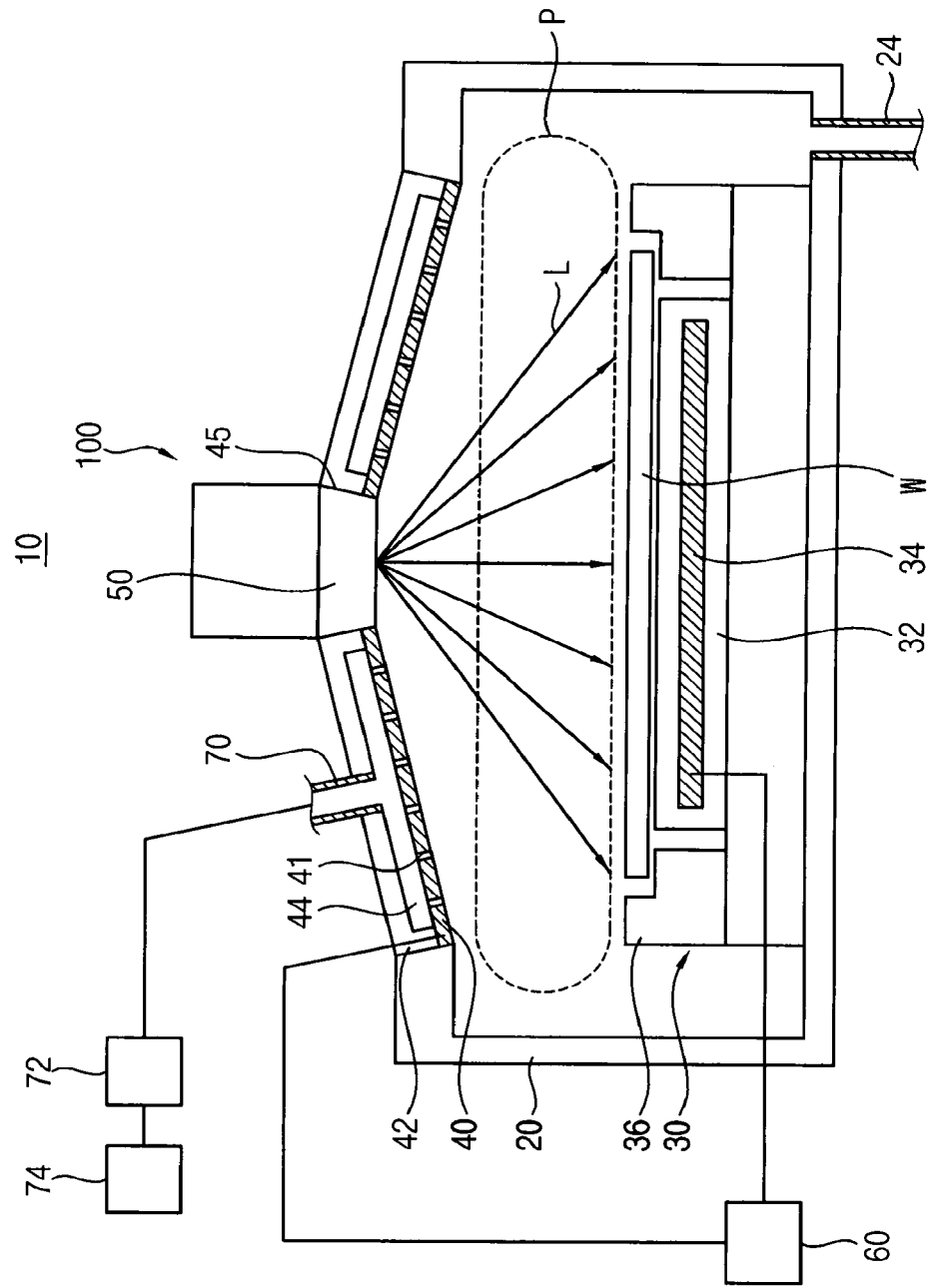
FIGS. 1 to 34 represent non-limiting, example embodiments as described herein.
Figure 2:
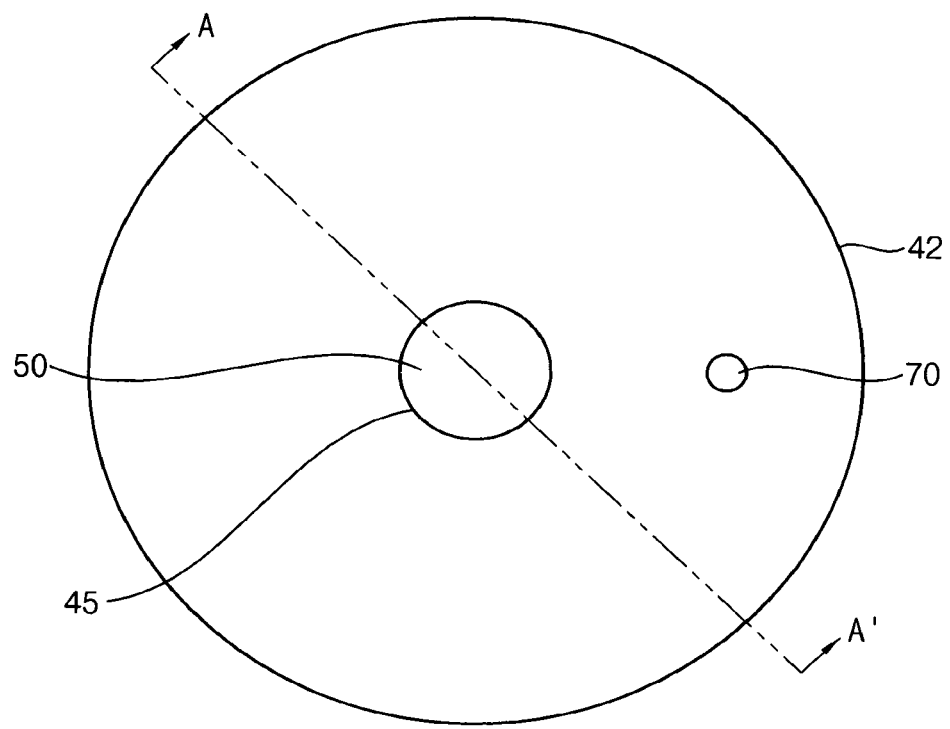
Figure 3:
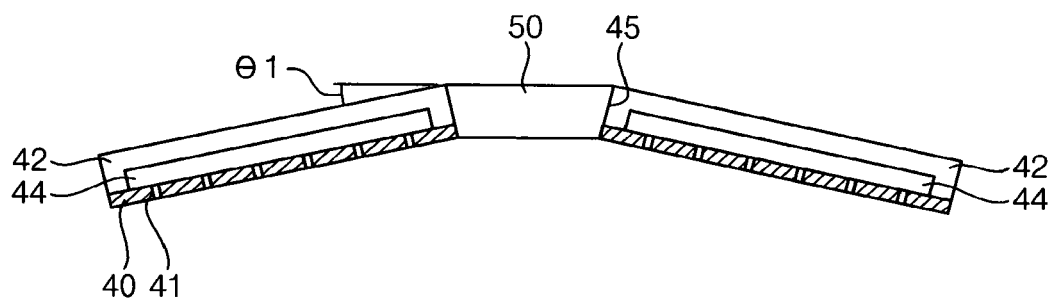
Figure 4:
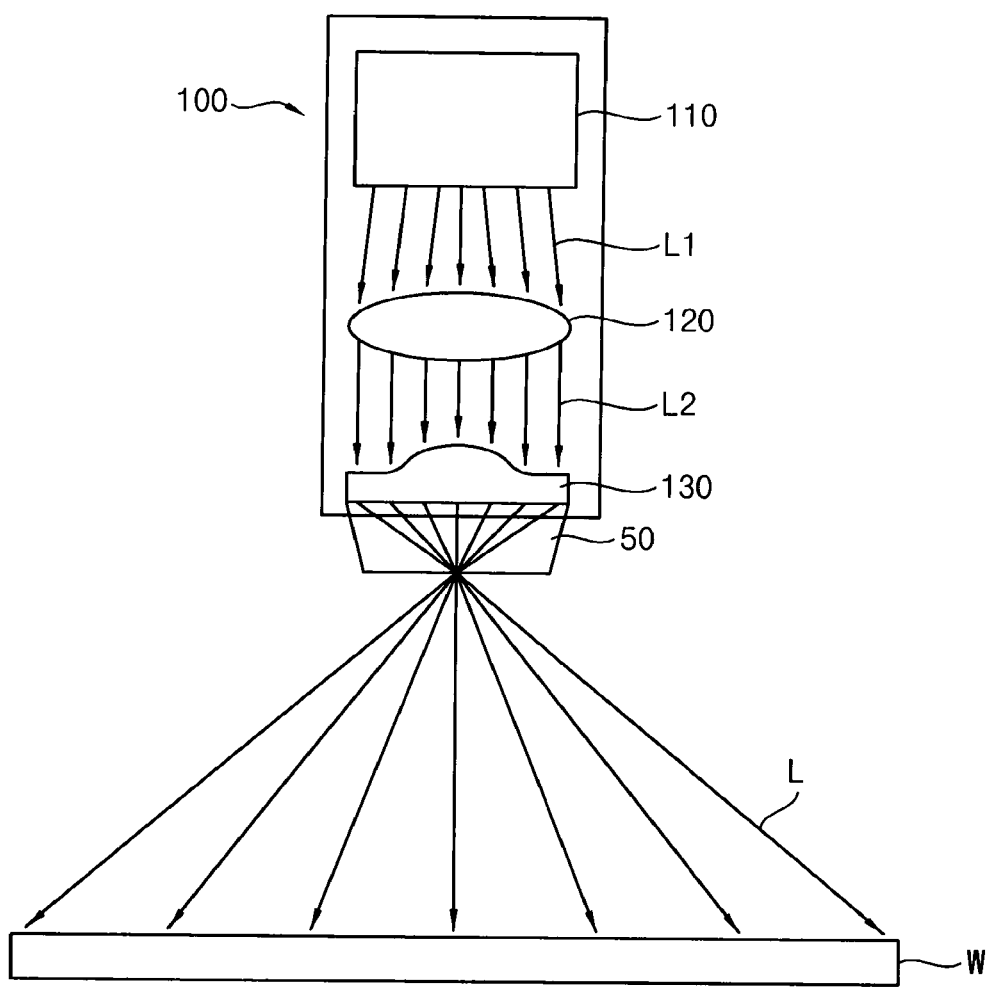
Figure 5:
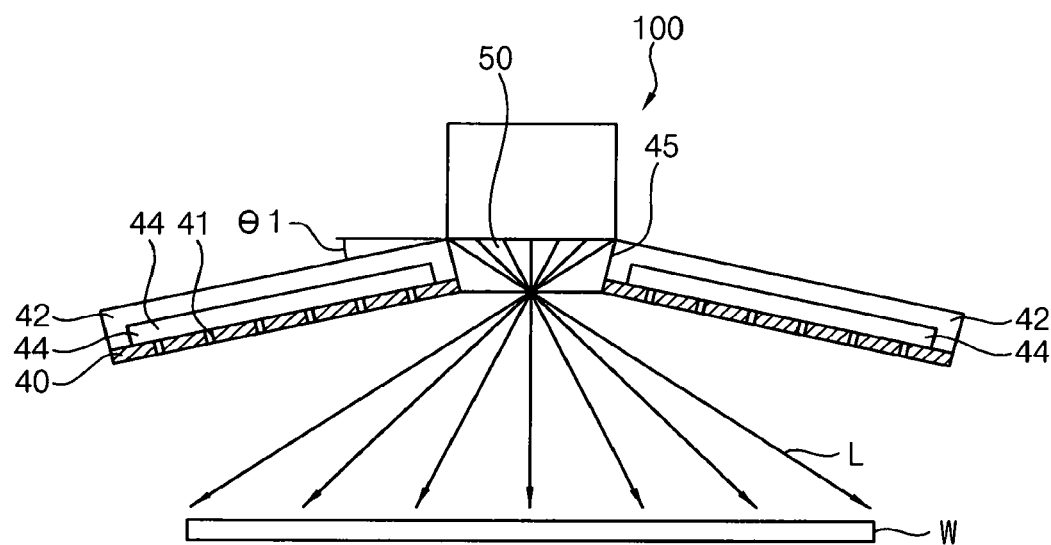
Figure 6:
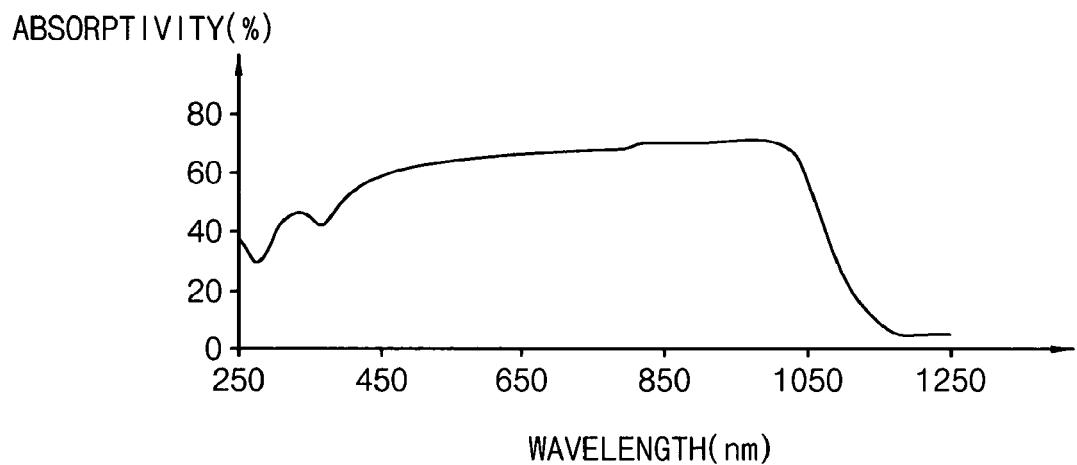

FIG. 1 is a block diagram illustrating a dry cleaning apparatus in accordance with example embodiments. FIG. 2 is a plan view illustrating a showerhead of the dry cleaning apparatus in FIG. 1. FIG. 3 is a cross-sectional view taken along the line A-A' in FIG. 2. FIG. 4 is a view illustrating a laser irradiator of the dry cleaning apparatus in FIG. 1. FIG. 5 is a view illustrating a laser light irradiated by the laser irradiator in FIG. 4. FIG. 6 is a graph illustrating absorptivity of laser when the laser light is irradiated on a wafer by the laser irradiator in FIG. 4.

Referring to FIGS. 1 to 6, a dry cleaning apparatus 10 may include a chamber 20, a substrate support 30, a shower head, a plasma generator, and a laser irradiator 100. The plasma generator may include a lower electrode 34, an upper electrode (e.g., 40 or 46, as described in greater detail below) and a power supply 60. Additionally, the dry cleaning apparatus 10 may further include an exhaust unit, etc.

In example embodiments, the dry cleaning apparatus 10 may be an apparatus configured to dry clean a material on a substrate such as a semiconductor wafer W disposed within a capacitively coupled plasma (CCP) chamber. However, the plasma generated by the dry cleaning apparatus is not be limited to the capacitively coupled plasma. For example, the plasma may be inductively coupled plasma, microwave plasma, etc. Here, the substrate may include a semiconductor substrate, a glass substrate, etc.

The substrate support 30 may be disposed within the chamber 20 to support the substrate. For example, the substrate support 30 may serve as a susceptor for supporting the wafer W thereon. The substrate support 30 may include a support plate 32 having an electrostatic electrode configured to hold the wafer W thereon using electrostatic force.

The substrate support 30 may include the lower electrode 34 in the support plate 32. For example, the lower electrode 34 may be circular plate-shaped. The substrate support 30 may be installed to move upwardly and downwardly by a driving portion (not illustrated). The substrate support 30 may further include a focus ring 36 on the support plate 32 to surround the wafer W. The focus ring 36 may have a ring shape.

A gate (not illustrated) for a loading/unloading of the wafer W may be provided in a sidewall of the chamber 20. The wafer W may be loaded/unloaded onto/from the substrate support 30 through the gate.

The exhaust unit may be connected to an exhaust port 24 which is installed in a bottom portion of the chamber 20, through an exhaust line. The exhaust unit may include a vacuum pump such as a turbo-molecular pump or the like, to control a pressure of the chamber 20 so that a processing space inside the chamber 20 may be depressurized to a desired vacuum level. Additionally, cleaning process byproducts and residual process gases may be discharged from the chamber 20 through the exhaust port 24.

The shower head may be provided as at least a portion of a vacuum lid assembly which covers an opening in an upper portion of the chamber 20. The shower head may be installed in the upper portion of the chamber 20 to supply a dry cleaning gas into the chamber 20. The shower head may include a manifold 40 having spray holes 41 formed therein and a shower head plate 42 as a baffle plate. The manifold 40 having the spray holes 41 may serve as a gas inlet to the chamber 20. For example, the dry cleaning gas may be supplied to the wafer within the chamber 20 through the spray holes 41 of the manifold 40.

The upper electrode may be provided as a portion of the shower head. For example, the upper electrode may be supported in the upper portion of the chamber 20 by an insulation shield member (not illustrated). The upper electrode may be arranged over the substrate support 30 to face the lower electrode 34. A space between the upper electrode and the lower electrode 34 may be used for a plasma generation region. The upper electrode may have a surface facing the wafer W placed on the substrate support 30.

The upper electrode may include an electrode plate having an annular shape. The manifold 40 may include a plurality of the spray holes 41 which are formed to penetrate through the manifold 40 to supply the dry cleaning gas into the chamber 20.

In particular, the shower head plate 42 as the baffle plate may include an annular shaped plate. The shower head plate 42 may support the manifold 40 and may diffuse and spray out the dry cleaning gas through the spray holes 41 of the manifold 40. The shower head plate 42 may include a gas diffusion chamber 44 therein, and the gas diffusion chamber 44 may be connected to the spray holes 41. The manifold 40 may be installed detachably in a lower surface of the shower head plate 42. The shower head plate 42 may include, for example, stainless steel, aluminum, anodized aluminum, nickel, or ceramic. The manifold 40 may include stainless steel, aluminum, anodized aluminum, nickel, or ceramic, to serve as the upper electrode. Alternatively, the shower head plate 42 may include a conductive material to serve as the upper electrode.

The dry cleaning apparatus 10 may further include a gas supply unit for supplying a dry cleaning gas into the chamber 20. For example, the gas supply unit may include a gas supply line 70, a flow controller 72 and a gas supply source 74, such as gas supply elements. The gas supply line 70 may be connected to the gas diffusion chamber 44 of the shower head plate 42, and the flow controller 72 may control an amount of the dry cleaning gas supplied into the chamber 20 through the gas supply line 70. For example, the gas supply source 74 may include a plurality of gas tanks, and the flow controller 72 may include a plurality of mass flow controllers (MFCs) that may control independently the supply amount of the dry cleaning gas supplied from the gas supply source 74. The dry cleaning gas may include $F_2$, $NH_3$, $HF_3$, $CH_4$, $O_3$, etc.

Alternatively, the gas supply unit may include a remote plasma source that generates ions, atoms, radicals and plasma species. The plasma species may be generated outside the chamber 20 and supplied there into through the shower head from the gas supply unit. The remote plasma source may receive a plasma gas, and may generate the plasma species such as radicals, ions, atoms, etc. The remote plasma source may be a plasma source type such as microwave, electron cyclotron resonance plasma source, etc.

As describe later, plasma may be generated from the dry cleaning gas by the power supply 60. Chemical species which do not absorb or barely absorb a laser light L emitted through an optical window 50 may be selected as the dry cleaning gas so that the energy of the laser light L may be delivered to the wafer W without loss.

The power supply 60 of the plasma generator may include a first power supply and a second power supply. The first power supply and the second power supply may apply a radio frequency (RF) power to the lower electrode 34 and the upper electrode to generate plasma P within the chamber 20. For example, the RF power may be applied to the upper electrode, and the lower electrode 34 may be grounded. The RF power may be applied to the lower electrode 34 and the upper electrode may be grounded. Powers having different phases may be applied to the upper electrode and the lower electrode 34. A direct current (DC) power may be used instead of the RF power.

The plasma may be generated from the dry cleaning gas by the power supply 60. The power supply 60 may have process recipe different from dry cleaning process recipe. The dry cleaning process recipe may provide low density, low energy and low bias plasma. For example, the radio frequency power having 13.56 MHz may be applied to the upper electrode. Bias of 0V to 500V may be applied to the wafer W.

A controller may be connected to the power supply 60 and control operations thereof. The controller having a microcomputer and various interface circuits may control an operation of the dry cleaning apparatus 10 based on programs and recipe information stored in an external or internal memory.

In example embodiments, the optical window 50 may be provided in an upper sidewall of the chamber 20. For example, the optical window 50 may be positioned to face the wafer W such that a bottom surface of the optical window 50 may be parallel to an upper surface of the wafer W. The optical window 50 may include a transparent material for transmitting a laser light. The optical window 50 may include a material such as glass, quartz, etc. The optical window 50 may have transmissivity of about 80%.

As illustrated in FIGS. 2 and 3, the optical window 50 may be arranged in a middle region of the shower head. The shower head may have an opening 45 in the middle region of the shower head. The opening 45 may penetrate through the shower head plate 42 and the manifold 40. The optical window 50 may be installed within the opening 45. Although it is not illustrated in the figures, the optical window 50 may be fastened in the opening 45 by a fastening member such as a screw, and a sealing member such as O-ring may airtightly seal the chamber 20 from the outside.

A lower surface of the shower head may be inclined at a first angle θ1 with respect to a surface of the wafer W to face the wafer W placed on the substrate support 30. The shower head plate 42 of the showerhead may be arranged to be inclined at the first angle θ1 with respect to an upper surface of the optical window 50 parallel with the surface of the wafer W. For example, the first angle θ1 may range from about 3 degrees to about 45 degrees.

The laser irradiator 100 may be installed adjacent to the optical window 50 of the shower head. The laser irradiator 100 may be disposed on the optical window 50 outside the chamber 20. The laser irradiator 100 may irradiate a laser light toward the wafer W through the optical window 50 to heat the wafer W to a desired temperature range. For example, the laser irradiator 100 may heat the wafer W to a temperature range of about 200° C. to 800° C.

As illustrated in FIGS. 4 and 5, the laser irradiator 100 may include a laser source 110 to generate a laser light L1 and an optical system to project the laser light L1 outputted from the laser source 110 with uniform intensity across the whole surface of the wafer W through the optical window 50. The laser source 110 may also be referred to as a laser. For example, the optical system may include a collimator 120 to transform the laser light L1 outputted from the laser source 110 into a collimated light L2 and an aspheric lens 130 to spread radially (spokewise) the collimated light L2. The laser light L passing through the aspheric lens 130 may be irradiated with uniform intensity across the whole surface of the wafer W through the optical window 50.

A diameter of the laser light L passing through the aspheric lens 130 may increase gradually away from a back focal plane, and a surface profile, position, etc of the aspheric lens 130 may be determined to irradiate the laser light L with uniform intensity across the whole surface of the wafer W. For example, the collimated light L2 may pass through the aspheric lens 130, converge toward the back focal plane thereof, cross the back focal plane and then diverge away from the back focal plane. The diameter of the laser light L irradiated on the surface of the wafer W by the aspheric lens 130 may be enlarged up to about 200% to about 1000% when compared with a diameter of the collimated light L2.

As illustrated in FIG. 6, absorptivity of laser in the wafer W may change depending on wavelength. The laser source 110 may generate a laser light having a wavelength of about 250 nm to about 1000 nm that falls within a maximum absorptivity range of the wafer W. A laser power may have a power of 100 W to 100 KW. The laser power may be controlled to adjust a raised surface temperature of the wafer W.

As mentioned above, the laser irradiator 100 may be disposed outside the chamber 20, and may irradiate a laser light with uniform intensity across the whole surface of the wafer W within the chamber 20 through the optical window 50 to the shower head.

By radiation heat transfer of the laser, the chamber 20 may be maintained at a constant temperature and the surface of the wafer W may be heated to a desired temperature range to increase a chemical reaction rate of the dry cleaning gas in vapor phase state or gas phase state, to thereby reduce process time of the dry cleaning process. Internal environment of the chamber 20 need not be affected to maintain cleaning permeation performance of the chemical material in gas phase state, and the temperature of the wafer W may be increased precisely to reduce the dry cleaning process time, to thereby improve process productivity and equipment stability.

Further, the optical window 50 may prevent the optical lenses of the laser irradiator 100 from being polluted by the chemical material vaporized from the wafer W by the radiation heat transfer of the laser.

Figure 7:
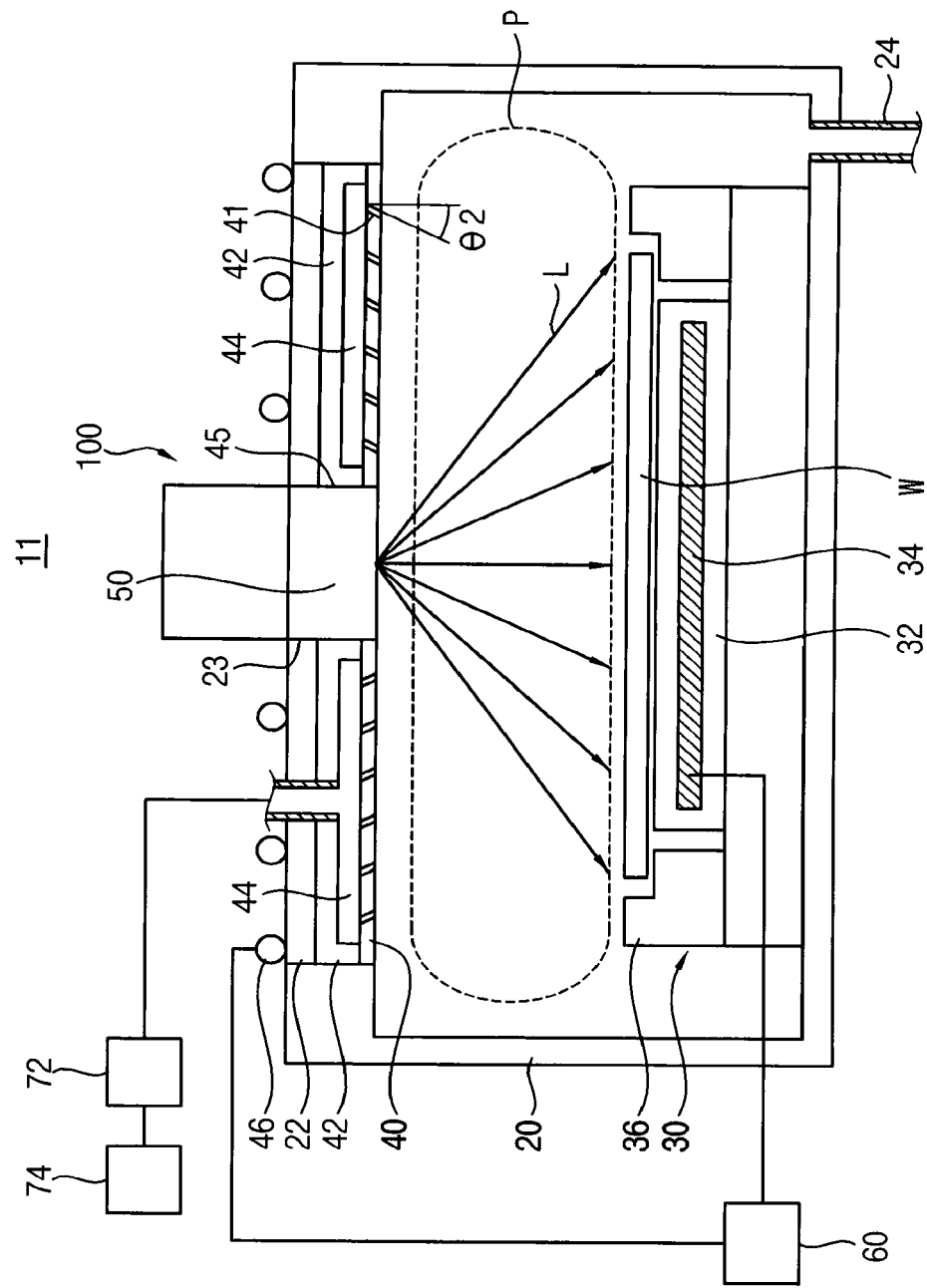
Figure 8:
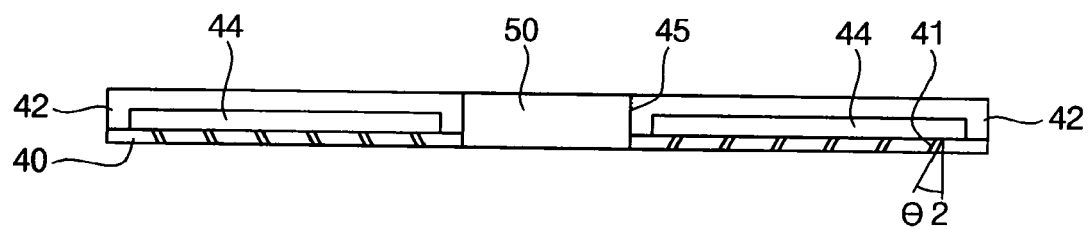

FIG. 7 is a block diagram illustrating a dry cleaning apparatus in accordance with example embodiments. FIG. 8 is a cross-sectional view illustrating a shower head of the dry cleaning apparatus in FIG. 7. The dry cleaning apparatus may be substantially the same as or similar to the dry cleaning apparatus described with reference to FIGS. 1 to 5 except for configurations of a plasma generator, a laser irradiator and a shower head. Thus, the same reference numerals will be used to refer to the same or like elements and any further repetitive explanation concerning the above elements will be omitted.

Referring to FIGS. 7 and 8, a dry cleaning apparatus 11 may include a chamber 20, a substrate support 30, a manifold 40, a shower head, a plasma generator, and a laser irradiator 100. The plasma generator may include a lower electrode 34, an upper electrode 46 and a power supply 60. For example, the upper electrode 46 and the manifold 40 are separated from each other.

In example embodiments, the dry cleaning apparatus 11 may be an apparatus configured to dry clean a material on a substrate such as a semiconductor wafer W disposed within an inductively coupled plasma (ICP) chamber.

In example embodiments, the upper electrode 46 may be disposed outside the chamber 20 such that the upper electrode 46 faces the lower electrode 34. The upper electrode 46 may include a radio frequency (RF) antenna. The antenna may have a plan coil shape. An electromagnetic field induced by the radio frequency antenna may be applied to a dry cleaning gas supplied within the chamber 20 to generate plasma.

The shower head may constitute at least a portion of a vacuum lid assembly which covers an opening of an upper portion of the chamber 20. The shower head may be arranged in the upper portion of the chamber 20. The upper electrode 46 may be arranged on a shower head plate 42 of the shower head. The shower head may include a dielectric material. For example, the shower head may include alumina ($Al_2O_3$). A RF power from the upper electrode 46 may be transferred into the chamber 20 through the shower head. That is, the shower head may function as a dielectric window of the ICP chamber.

In example embodiments, the chamber 20 may include a cover 22 covering the upper portion of the chamber 20. The cover 22 may airtightly seal the upper portion of the chamber 20. The upper electrode 46 may be arranged on the cover 22 to face the lower electrode 34. The cover 22 may include a circular plate shaped dielectric window. For example, the dielectric window may include alumina ($Al_2O_3$).

In this case, the upper electrode 46 may be arranged on the cover 22. The upper electrode 46 may include a radio frequency (RF) antenna. The antenna may have a coil shape. The cover may include a circular plate shaped dielectric window. For example, the dielectric window may include alumina ($Al_2O_3$). The power from the antenna may be transferred into the chamber 20 through the dielectric window.

An optical window 50 may be installed in an opening 23 in a middle region of the cover 22 and an opening 45 in a middle region of the shower head. Accordingly, the chamber 20 may have the optical window 50 in the cover 22 as an upper wall of the chamber 20.

In example embodiments, a lower surface of the shower head may extend to be parallel with a surface of the wafer W. An upper surface of the shower head plate 42 of the shower head may be coplanar with an upper surface of the optical window 50 parallel with the surface of the wafer W. In here, spray holes 41 of the shower head may extend toward the wafer W to be inclined at a second angle θ2 with respect to the surface of the wafer W. For example, the second angle θ2 may range from about 3 degrees to about 45 degrees.

Accordingly, the shower head may supply the dry cleaning gas uniformly across a whole surface of the wafer W to thereby provide uniform distribution of plasma.

Figure 9:
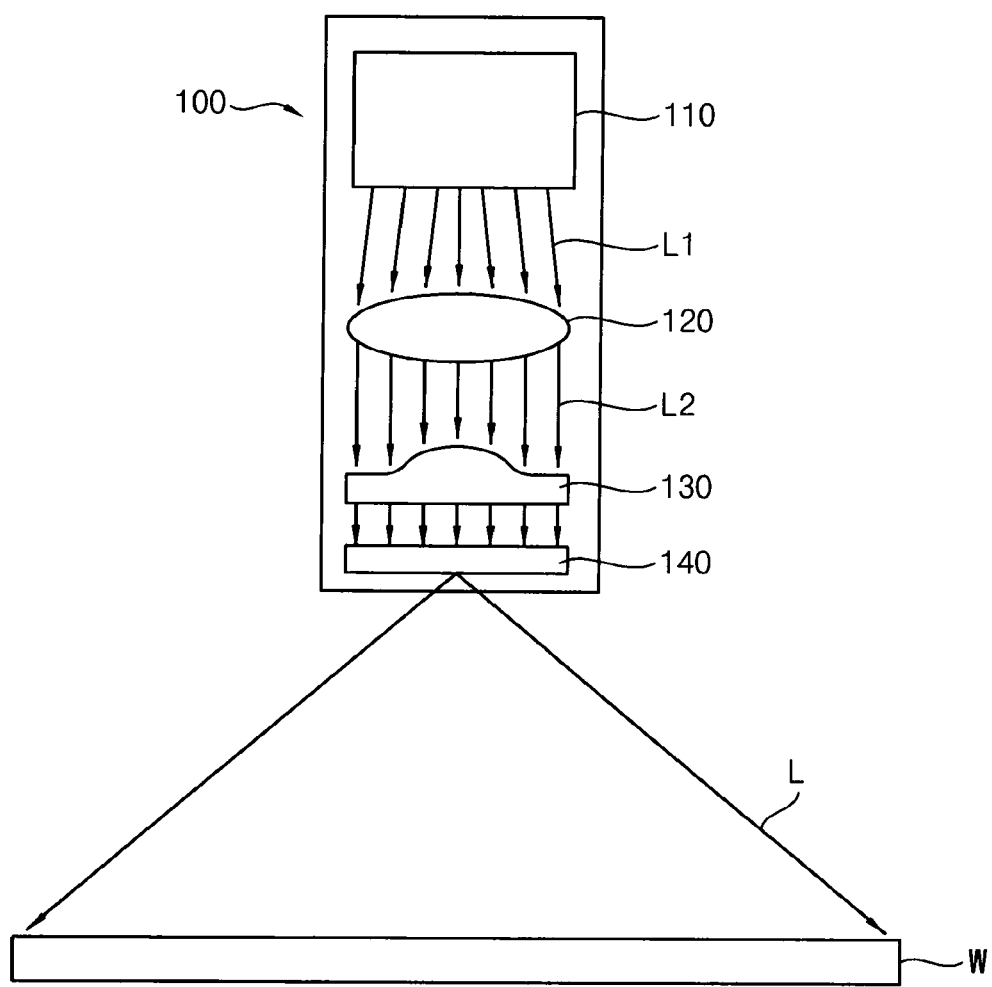
Figure 10:
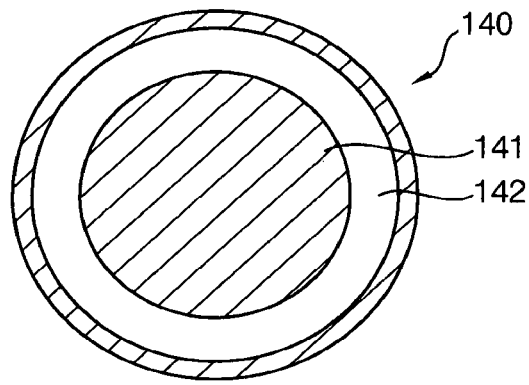
Figure 11:
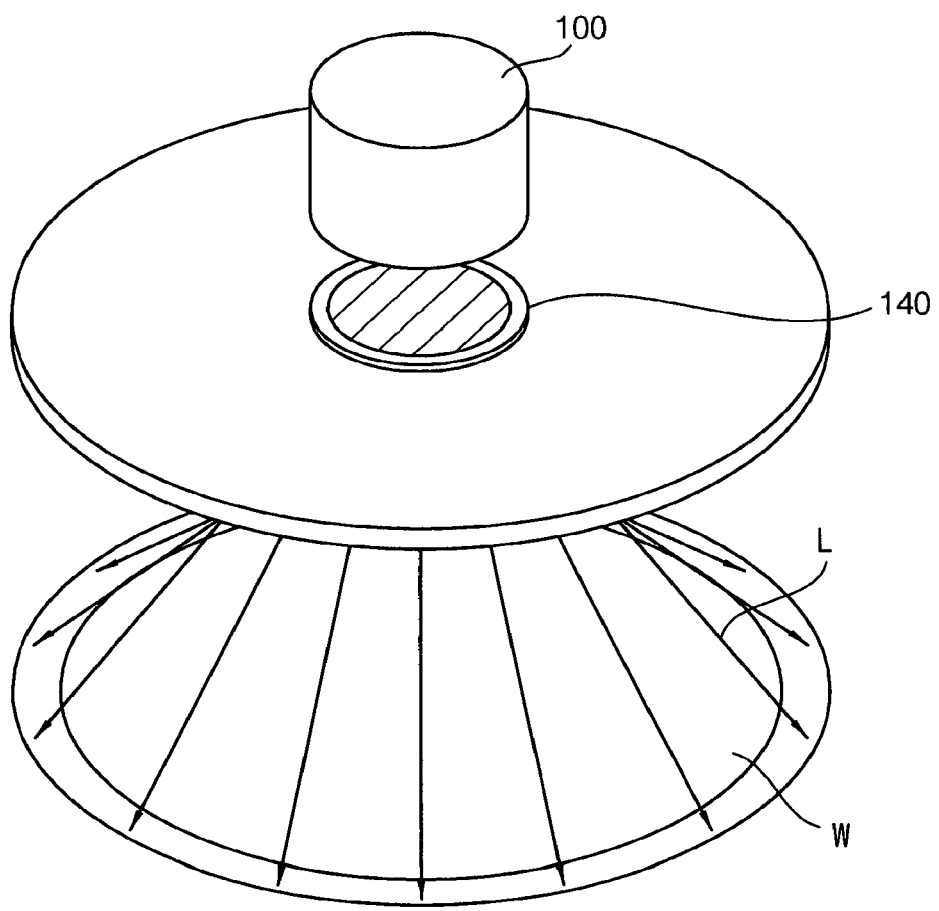

FIG. 9 is a view illustrating a laser irradiator of a dry cleaning apparatus in accordance with example embodiments. FIG. 10 is a plan view illustrating an optical mask of a laser irradiator in FIG. 9. FIG. 11 is a perspective view illustrating a laser light irradiated on a wafer by the laser irradiator in FIG. 9. The laser irradiator may be substantially the same as or similar to the laser irradiator described with reference to FIGS. 1 to 5 except for an additional optical mask. Thus, the same reference numerals will be used to refer to the same or like elements and any further repetitive explanation concerning the above elements will be omitted.

Referring to FIGS. 9 to 11, a laser irradiator of a dry cleaning apparatus may further include an optical mask 140 configured to selectively transmit a laser light L passing through an aspheric lens 130.

The optical mask 140 may have a first region 141 and a second region 142. The first region 141 may have a first transmissivity, and the second region 142 may have a second transmissivity greater than the first transmissivity. The first region 141 may be a blocking pattern to block the laser light L from passing therethrough, and the second region 142 may be a transparent pattern to allow the laser light L to pass therethrough.

The laser light L of the laser irradiator 100 may be irradiated on a desired region on the wafer W through the transparent pattern of the optical mask 140. The second region 142 may have an annular shape such that the laser light L may be irradiated on a peripheral region of the wafer W.

Figure 12:
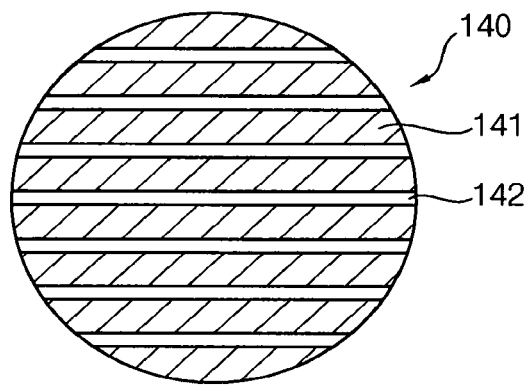
Figure 13:
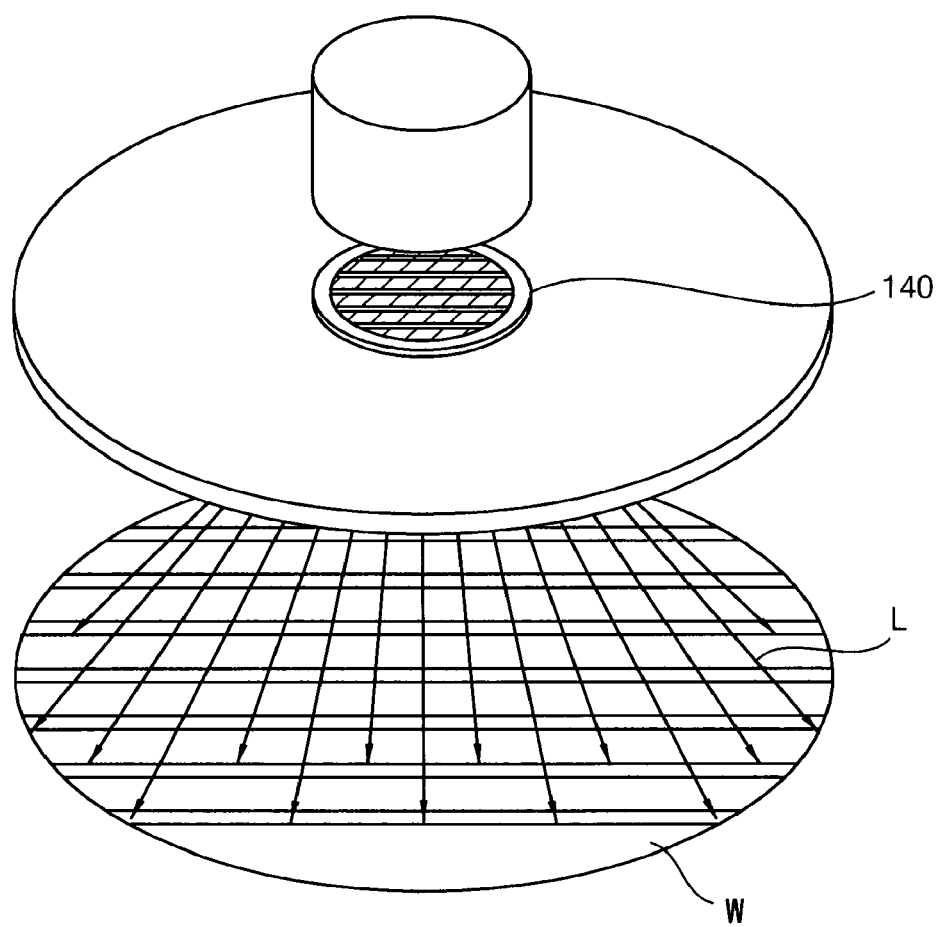

FIG. 12 is a view illustrating an optical mask of a laser irradiator in accordance with example embodiments. FIG. 13 is a perspective view illustrating a laser light irradiated on a wafer by the laser irradiator in FIG. 12. The laser irradiator may be substantially the same as or similar to the laser irradiator described with reference to FIGS. 9 to 11 except for a shape of a transparent pattern. Thus, the same reference numerals will be used to refer to the same or like elements and any further repetitive explanation concerning the above elements will be omitted.

Referring to FIGS. 12 and 13, an optical mask 140 may a first region 141 and a second region 142. The first region 141 may have a first transmissivity, and the second region 142 may have a second transmissivity greater than the first transmissivity. The first region 141 may be a blocking pattern to block a laser light L from passing therethrough, and the second region 142 may be a transparent pattern to allow the laser light L to pass therethrough.

The laser light L of the laser irradiator 100 may be irradiated on a desired region on the wafer W through the transparent pattern of the optical mask 140. The first and second regions 141, 142 may have a stripe shape. The first and second regions 141, 142 may be arranged alternately and repeatedly in a first direction. Alternatively, the first and second regions 141, 142 may be arranged in a grid pattern.

Hereinafter, a method of dry cleaning a substrate using the dry cleaning apparatus in FIGS. 1 and 7 will be explained.

Figure 14:
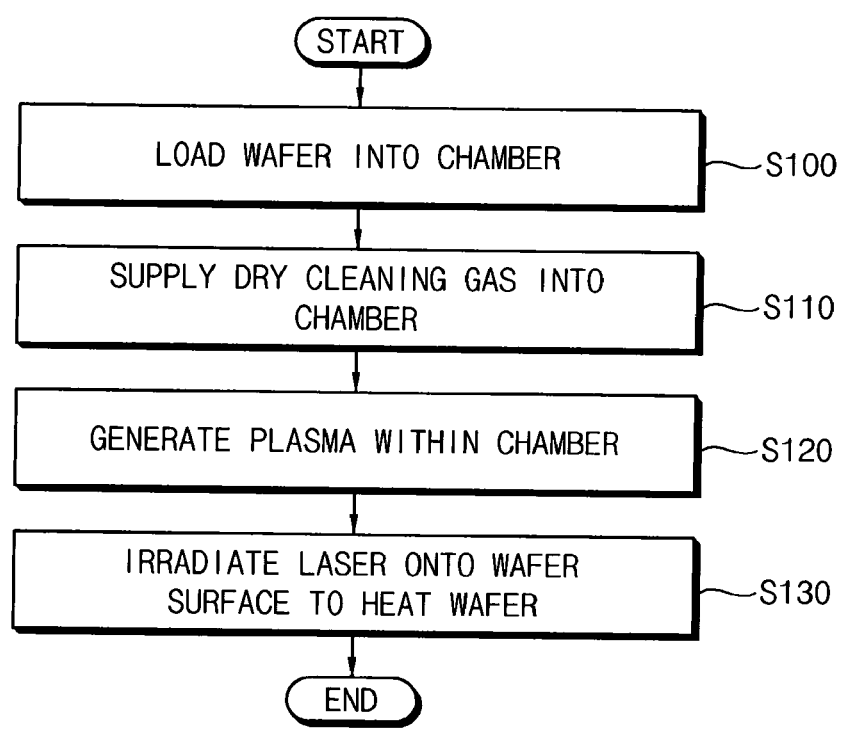

FIG. 14 is a flow chart illustrating a dry cleaning method in accordance with example embodiments.

Referring to FIGS. 1, 5, 7 and 14, first, a substrate such as a wafer W to be cleaned may be loaded into a chamber 20 (S100), and a dry cleaning gas may be supplied into the chamber 20 (S110).

In example embodiments, the wafer W may be loaded into the chamber 20 of a dry cleaning apparatus 10, 11, and the dry cleaning gas may be supplied onto the wafer W.

First, the semiconductor wafer W may be loaded on an electrostatic chuck of a substrate support 30 within the chamber 20. The dry cleaning gas may be introduced into the chamber 20 through spray holes 41 of a shower head and then a pressure of the chamber 20 may be controlled to a desired vacuum level by a gas exhaust unit. The dry cleaning gas may include $F_2$, $NH_3$, $HF_3$, $CH_4$, $O_3$, etc.

Then, plasma may be generated within the chamber 20 (S120), and a laser light may be irradiated on a surface of the wafer W to heat the wafer W (S130). Though FIG. 14 depicts these steps occurring in a particular order, the present inventive concept is not limited thereto. For example, the plasma generation (S120) and the irradiation of the wafer W (S130) may be performed at the same time, the irradiation of the wafer W (S130) may be performed during a time when the plasma is generated (S120) or the generation of the plasma (S120) may be performed during a time when the laser light is irradiated on the wafer W.

For example, a radio frequency power may be applied to a lower electrode 34 and an upper electrode to generate plasma within the chamber 20. The plasma may be generated from the dry cleaning gas supplied into the chamber 20. The dry cleaning process recipe may provide low density, low energy and low bias plasma.

The dry cleaning gas in a vapor phase state or a gas phase state, that is, dry cleaning gas plasma may react with residual material on the wafer W.

Then, a laser irradiator 100 may irradiate a laser light L on a whole surface of the wafer W through an optical window 50. Similar to above, though these steps are described in a particular order, the present inventive concept is not limited thereto. For example, the laser irradiator 100 may irradiate the laser light L on the whole surface of the wafer W through the optical window 50 during a time when the dry cleaning gas plasma reacts with the residual material on the wafer W.

A laser light L1 outputted from a laser source 110 may be transformed into a collimated light L2 by a collimator 120, and the collimated light L2 may be spread radially by an aspheric lens 130. The laser light L passing through the aspheric lens 130 may be irradiated with uniform intensity across the whole surface of the wafer W through the optical window 50. A diameter of the laser light L irradiated on the surface of the wafer W by the aspheric lens 130 may be enlarged up to about 200% to about 1000% when compared with a diameter of the collimated light L2.

By radiation heat transfer of the laser, the surface of the wafer W may be heated to a desired temperature range. Thus, a chemical reaction rate of the dry cleaning gas in vapor phase state or gas phase state may be increased to thereby reduce process time of the dry cleaning process.

For example, the surface of the wafer W may be increased to a sublimation temperature of a cleaning process by-product generated from the reaction of the dry cleaning gas with a residual material (or an etch residue) left from an etch process, for example. The cleaning process by-product at the sublimation temperature may be transitioned into a gaseous cleaning process by-product and the gaseous cleaning process by-product may be discharged through an exhaust port 24 from the chamber 20. This dry cleaning process of removing the etch residue, for example, will be describe in detail with reference to FIGS. 15 to 17.

Hereinafter, a method of forming a pattern of a semiconductor device using the dry cleaning method in FIG. 14 will be explained.

Figure 15:
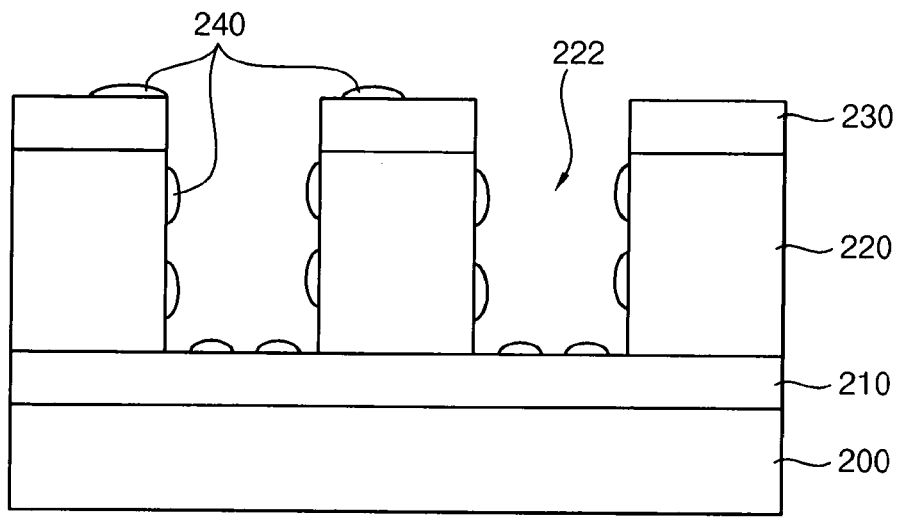
Figure 16:
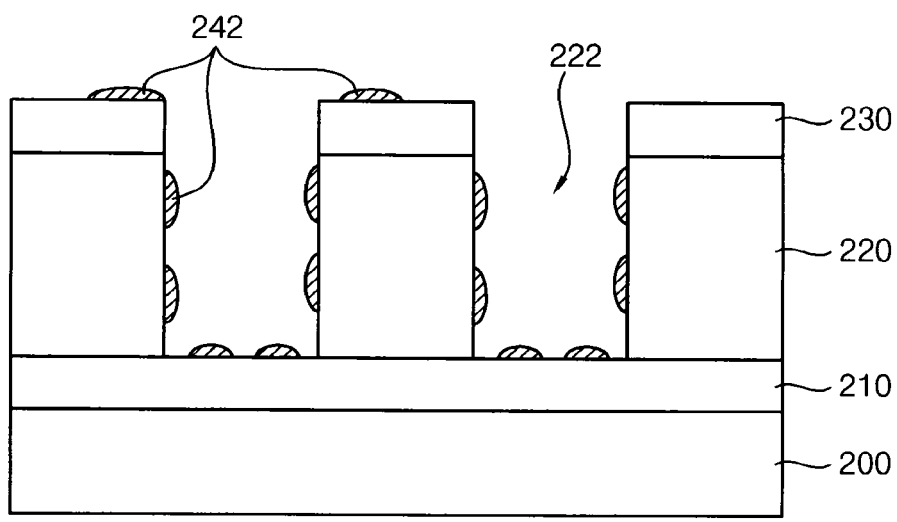
Figure 17:
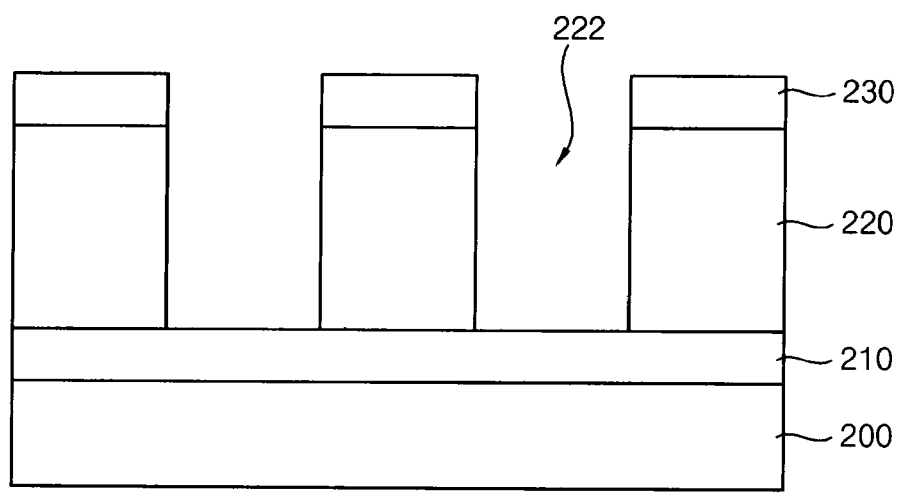

FIGS. 15 to 17 are cross-sectional views illustrating a method of forming a pattern of a semiconductor device in accordance with example embodiments.

Referring to FIG. 15, after a thin layer 210 and an object layer 220 are sequentially formed on a semiconductor substrate 200, a photoresist pattern 230 may be formed on the object layer 220.

The object layer 220 may include a metal layer, a metal nitride layer, an insulation layer, a semiconductor layer, etc. For example, the object layer 220 may include a nitride layer, a silicon nitride layer, a silicon layer, a polysilicon layer, a silicon oxide layer, etc. Alternatively, the object layer 220 may include a titanium nitride layer, a titanium layer, a tungsten layer, a tungsten nitride layer, etc. The object layer 220 may include an organic layer having an excellent gap filling property. For example, the object layer 220 may include a bottom anti reflective coating (BARC), a spin on hard mask layer (SOH), an amorphous carbon layer, etc.

After a photoresist layer is formed on the object layer 220, the photoresist layer may be exposed to form a photoresist pattern 230.

After an exposure mask having a desired pattern is aligned over the photoresist layer, a light may be irradiated onto the exposure mask and a portion of the photoresist layer may be reacted with a light from the exposure mask. Examples of the light used for the exposure process may be KrF, ArF, EUV (Extreme Ultra Violet), VUV, E-beam, X-ray, an ion beam, etc.

The exposed portion of the photoresist layer may be dissolved by a developer and removed to form the photoresist pattern 230. For example, the photoresist pattern 230 may have a line and space shape having a relatively small line width.

Then, an etch process may be performed using the photoresist pattern 230 as an etch mask on the object layer 220. A portion of the object layer 220 exposed by the photoresist pattern 230 may be removed by the etch process, to form an opening 222 in the object layer 220.

After performing the etch process, a residual material 240 may remain on the semiconductor substrate 200. The residual material 240 may also be referred to as an etch residue. For example, when the object layer 220 includes silicon, the residual material 240 may be a material containing silicon. To remove the residual material 240, the above-mentioned dry cleaning method may be performed on the semiconductor substrate 200.

Alternatively, the object layer may be a polysilicon layer formed on a silicon wafer, a metal layer such as a tungsten layer, an organic layer such as the photoresist pattern, etc. In this case, the dry cleaning method may be performed on the object layer.

Referring to FIG. 16, the residual material 240 on the semiconductor substrate 200 may be chemically reacted with a dry cleaning gas plasma to form a chemical material 242 as a cleaning process by-product. The dry cleaning gas plasma may be generated from the dry cleaning gas supplied to the chamber 20 as shown in FIG. 1.

For example, the semiconductor substrate 200 may be loaded into the chamber 20 of a dry cleaning apparatus in FIG. 1 or FIG. 7, and a dry cleaning gas may be supplied onto the semiconductor substrate 200. The dry cleaning gas may include $F_2$, $NH_3$, $HF_3$, $CH_4$, $O_3$, etc. In an exemplary embodiment, the semiconductor substrate 200 with the etch residue formed in the etch process may be loaded into the chamber 20 of the dry cleaning apparatus of FIG. 1 or 7. The present inventive concept is not limited thereto. For example, the etch process may be performed on the semiconductor substrate 200 within the dry cleaning apparatus of FIG. 1 or 7 and then without loading the semiconductor substrate 200 into the chamber, the dry cleaning gas may be supplied onto the semiconductor substrate 200.

Then, a plasma power may be applied to generate plasma within the chamber 20. For example, a radio frequency (RF) power may be applied to a lower electrode 34 and an upper electrode (40 or 42 in FIGS. 1 and 46 in FIG. 7) to generate plasma within the chamber 20. In an exemplary embodiment, the lower electrode 34 and the upper electrode may receive an RF power independently so that a substrate bias formed on the wafer W may be independently controlled from the generation of the plasma. The plasma may be generated from the dry cleaning gas supplied into the chamber 20. The dry cleaning process recipe may provide low density, low energy and low bias plasma.

The dry cleaning gas plasma may react with the residual material 240 on the semiconductor substrate 200 to form the chemical material 242.

Referring to FIG. 17, a laser light may be irradiated on a surface of the semiconductor substrate 200 to heat the semiconductor substrate 200, to remove the chemical material 242 by forming a gaseous cleaning process by-product. In an exemplary embodiment, the laser light may be irradiated in-situ on the semiconductor substrate during a time when being subject to the dry cleaning gas plasma that reacts with the residual material 240. For example, the irradiation of the laser light and the generation of the dry cleaning gas plasma to be reacted with the residual material 240 may be performed at the same time.

In example embodiments, a laser irradiator 100 may irradiate a laser light L on a whole surface of the semiconductor substrate 200 through an optical window 50. The laser light L passing through an aspheric lens 130 of the laser irradiator 100 may be irradiated with uniform intensity across the whole surface of the semiconductor substrate 200 through the optical window 50.

By radiation heat transfer of the laser, the surface of the semiconductor substrate 200 may be heated to a desired temperature range. Thus, a chemical reaction rate of the dry cleaning gas in vapor phase state or gas phase state may be increased to thereby increase processing speed of the dry cleaning process.

For example, the surface of the semiconductor substrate 200 may be increased to a sublimation temperature of the cleaning process by-product transformed from the residual material 240. The cleaning process by-product may be transitioned into a gaseous cleaning process by-product at the sublimation temperature. The gaseous cleaning process by-product may be discharged through an exhaust port 24 from the chamber 20.

After the etch process, the dry cleaning method may be used to remove the residual material left on a polysilicon layer, a metal layer, an oxide layer, for example.

Figure 18:
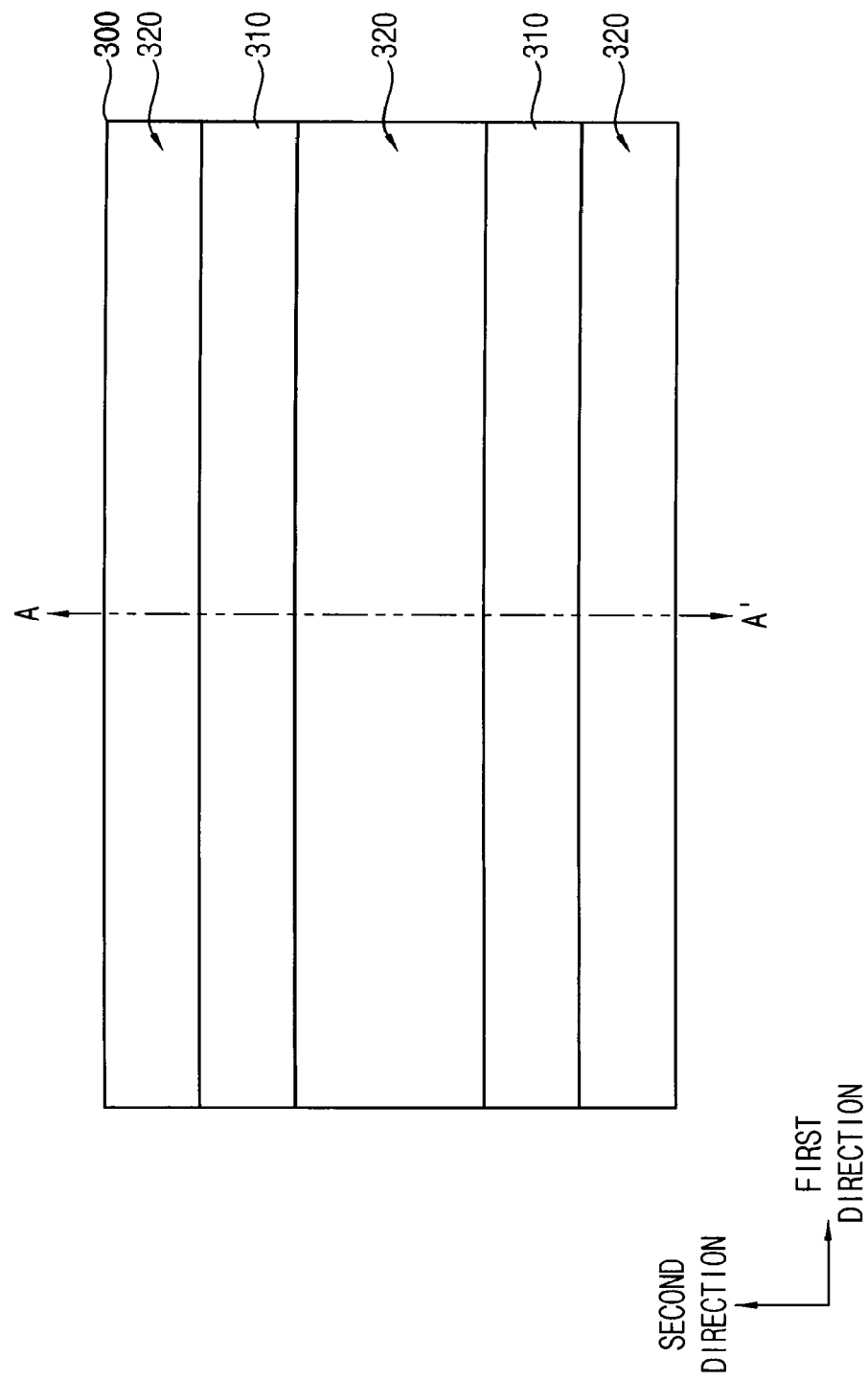
Figure 19:
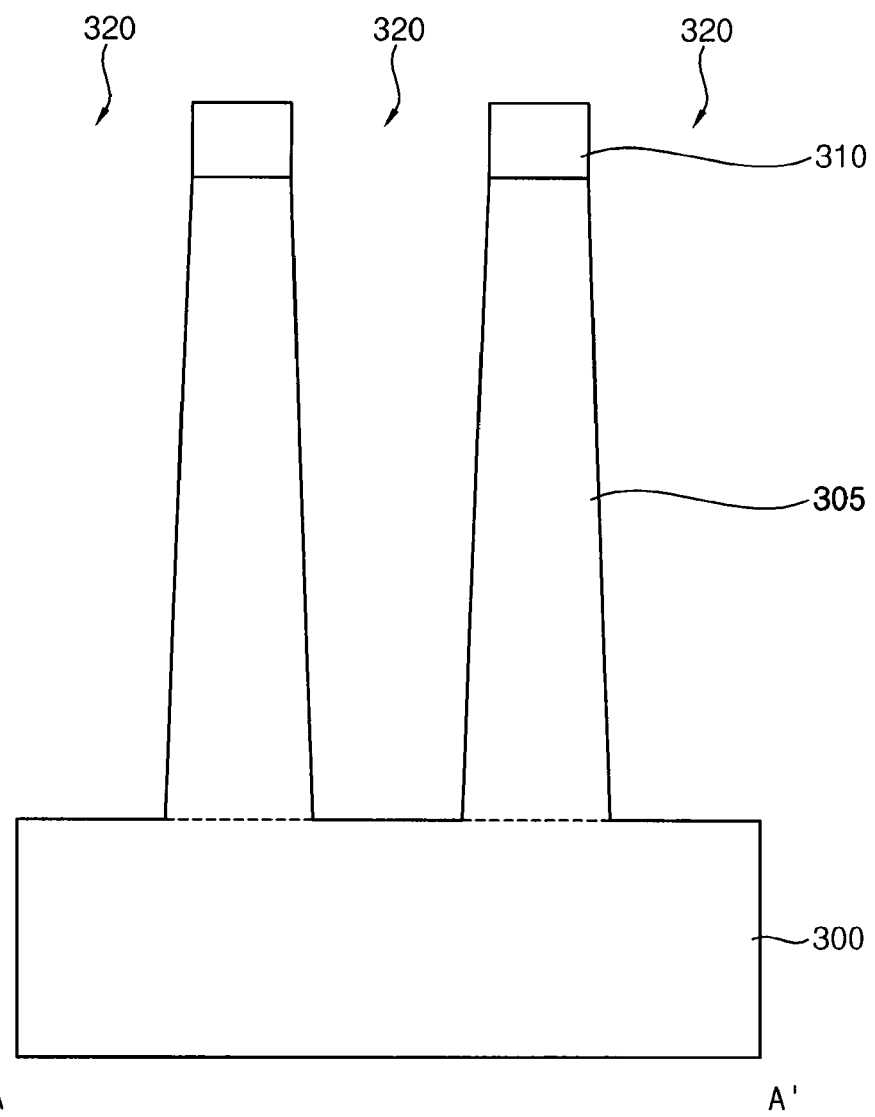
Figure 20:
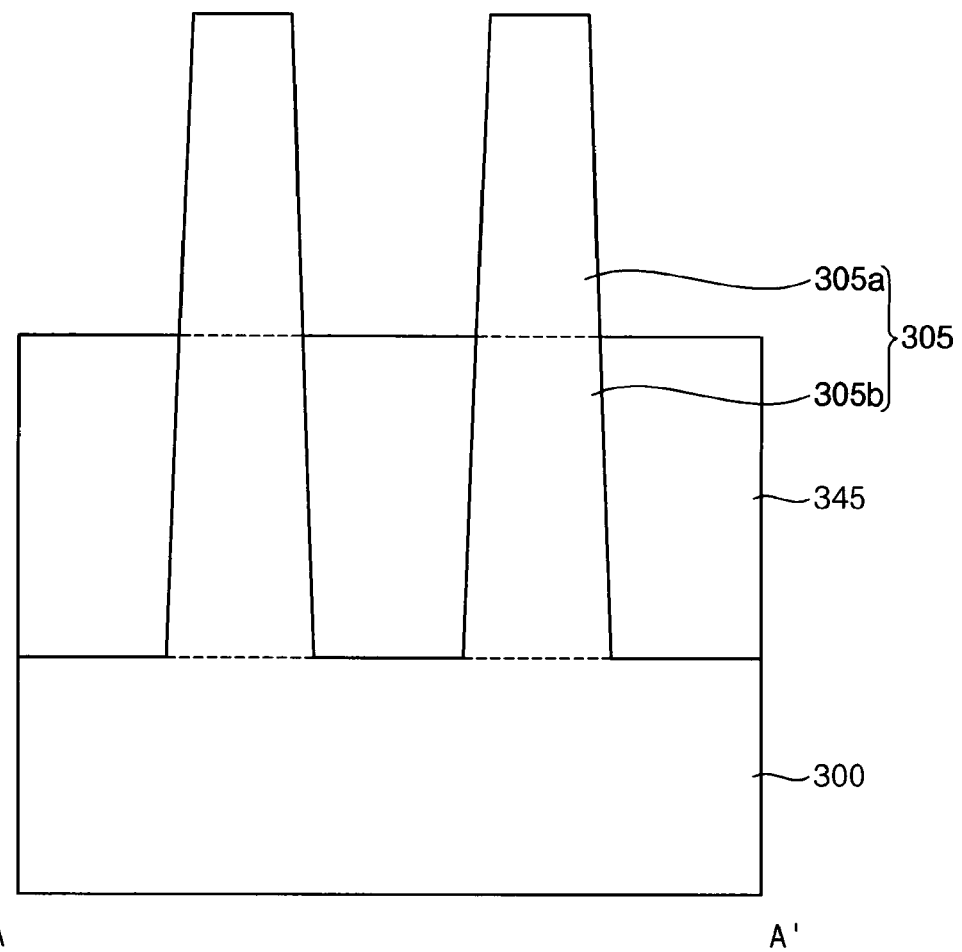
Figure 21:
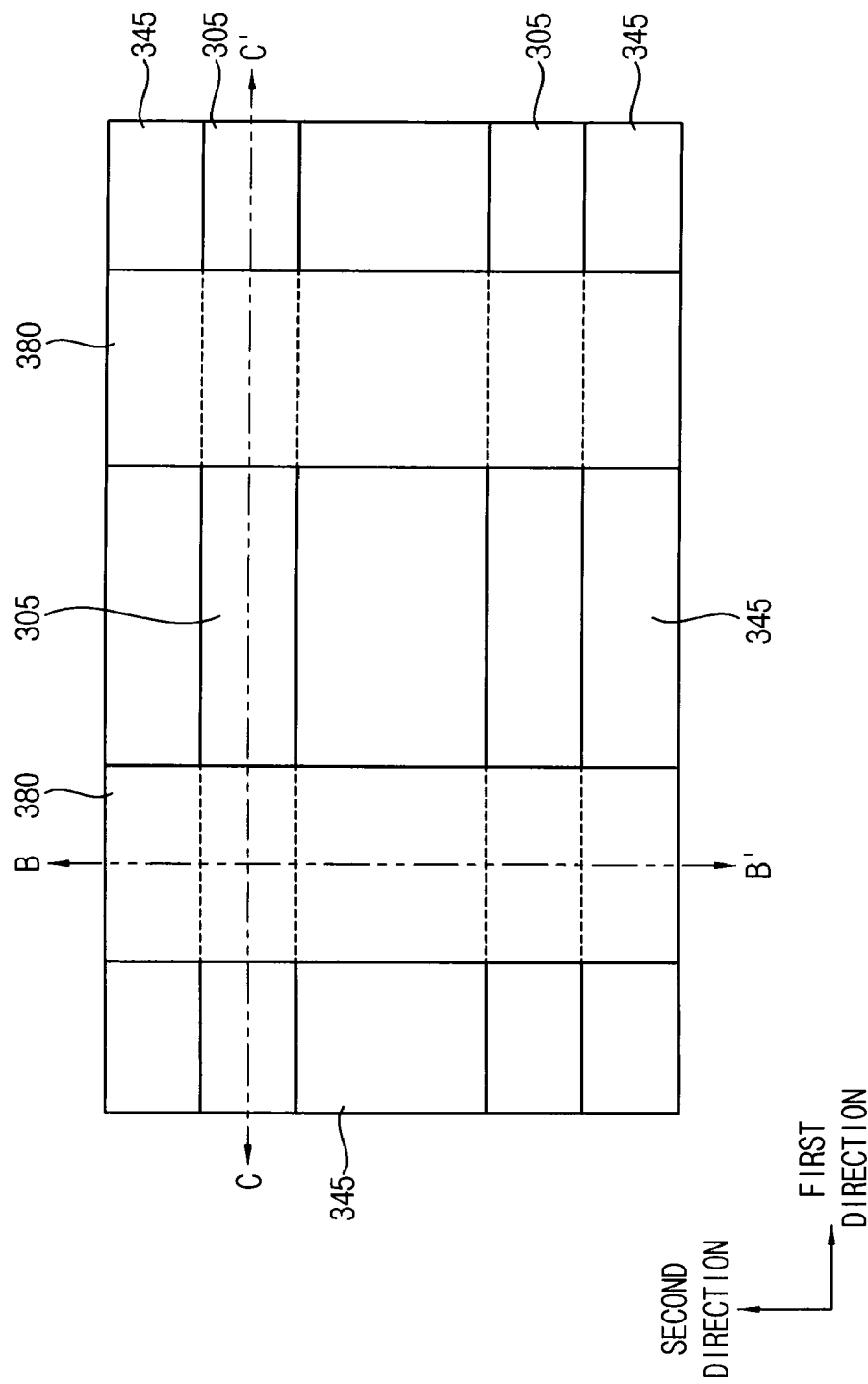

FIGS. 18 to 27 are plan views and cross-sectional views illustrating stages of a method of manufacturing a semiconductor device in accordance with example embodiments. Particularly, FIGS. 18 and 21 are plan views, and FIGS. 19, 20 and 22-27 are cross-sectional views.

Figure 22:
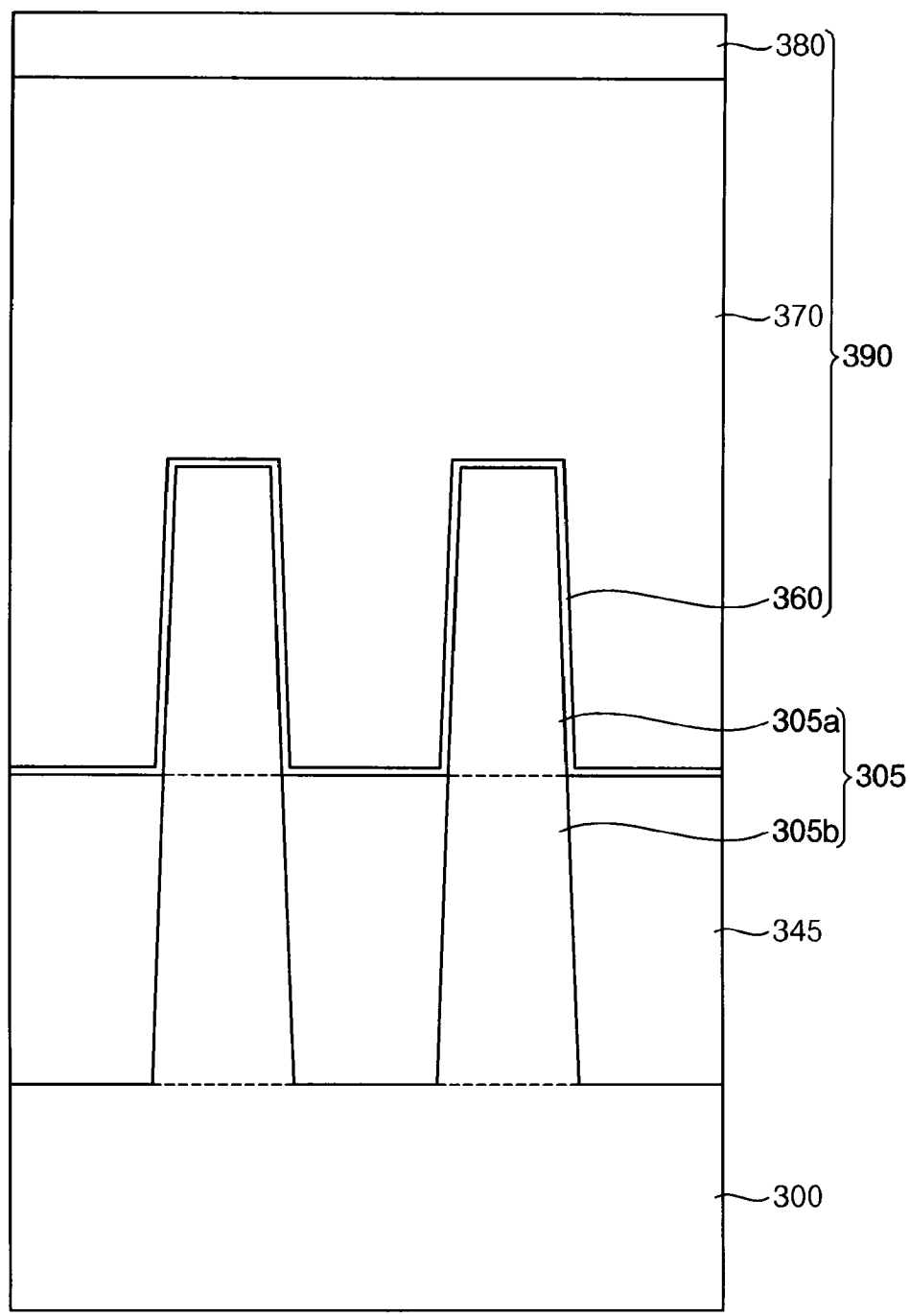

FIGS. 19 and 20 are cross-sectional views taken along lines A-A' of FIG. 18 and FIG. 22 is a cross-sectional view taken along lines B-B' of FIG. 21, and FIGS. 23 to 27 are cross-sectional views taken along line C-C' of FIG. 21.

Referring to FIGS. 18 and 19, an upper portion of a semiconductor substrate 300 may be partially etched to form an active fin 305. Accordingly, the active fin 305 may protrude in a vertical direction substantially perpendicular to an upper surface of the semiconductor substrate 300, and may include the same material as that of the semiconductor substrate 300.

In example embodiments, after forming a first mask 310 on the semiconductor substrate 300, the upper portion of the semiconductor substrate 300 may be etched using the first mask 310 as an etch mask to form the active fin 305. The active fin 305 may extend in a first direction substantially parallel to the upper surface of the semiconductor substrate 300, and a plurality of the active fins 305 may be formed in a second direction substantially parallel to the upper surface of the semiconductor substrate 300 and intersecting the first direction. In example embodiments, the first and second directions may be orthogonal to each other.

A first recess 320 may be formed between the active fins 305 in the second direction. That is, the active fins 305 may be spaced apart from each other in the second direction by the first recess 320.

Referring to FIG. 20, an isolation structure 345 may be formed fill a lower portion of the first recess 320.

In example embodiments, after forming a blocking layer on the active fin 305, the first mask 310 and the semiconductor substrate 300 to partially or entirely fill the first recess 320, an upper portion of the blocking layer may be removed to form the isolation structure 345 filling the lower portion of the first recess 320.

The blocking layer may include a material having a high etch selectivity with respect to an oxide, a nitride such as silicon nitride, a carbide such as silicon carbide, polysilicon, etc. The blocking layer may be formed to fill at least the lower portion of the first recess 320.

The active fin 305 may include a lower active pattern 305b of which a sidewall may be surrounded by the isolation structure 345, and an upper active pattern 305a protruding from an upper surface of the isolation structure 345 in the vertical direction.

Figure 23:
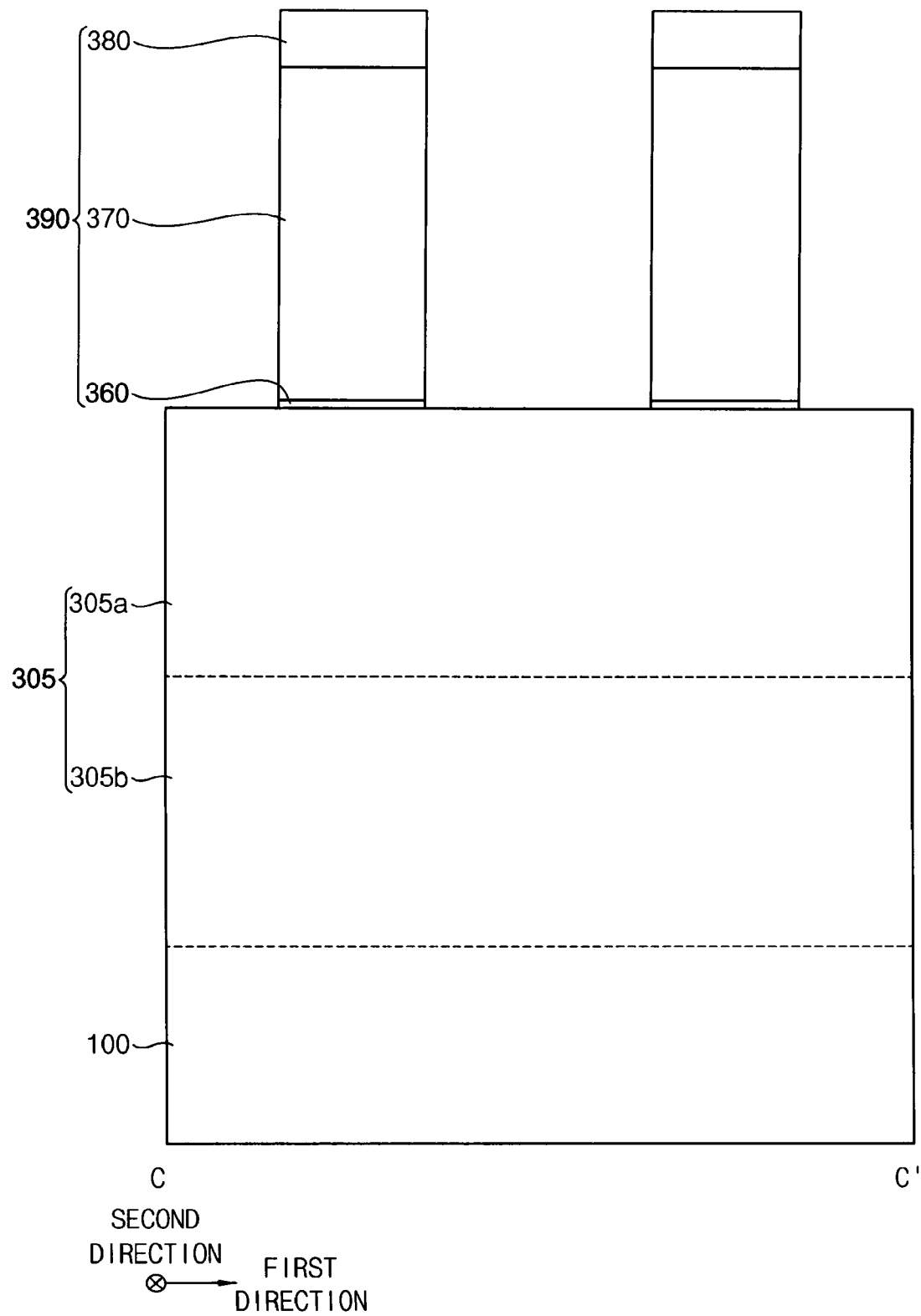

Referring to FIGS. 21 to 23, a dummy gate structure 390 may be formed on the active fin 305 and the isolation structure 345.

A dummy gate insulation layer, a dummy gate electrode layer and a dummy gate mask layer may be sequentially formed on the active fin 305 and the isolation structure 345, the dummy gate mask layer may be patterned to form a dummy gate mask 380, and the dummy gate electrode layer and the dummy gate insulation layer may be sequentially etched using the dummy gate mask 380 as an etch mask to form the dummy gate structure 390.

Accordingly, the dummy gate structure 390 including a dummy gate insulation pattern 360, a dummy gate electrode 370 and the dummy gate mask 380 sequentially stacked may be formed on the semiconductor substrate 300.

The dummy gate insulation layer may include an oxide, e.g., silicon oxide, the dummy gate electrode layer may include polysilicon, and the dummy gate mask layer may include a nitride, e.g., silicon nitride.

The dummy gate insulation layer may be formed by a chemical vapor deposition (CVD) process, or an atomic layer deposition (ALD) process, for example. Alternatively, the dummy gate insulation layer may be formed by performing a thermal oxidation process on the upper active pattern 305a of the active fin 305, and in this case, the dummy gate insulation layer may be formed only on an upper surface of the upper active pattern 305a. The dummy gate electrode layer and the dummy gate mask layer may be also formed by a CVD process, or an ALD process, for example.

The dummy gate structure 390 may extend in the second direction, and a plurality of dummy gate structures 390 may be formed in the first direction.

Figure 24:
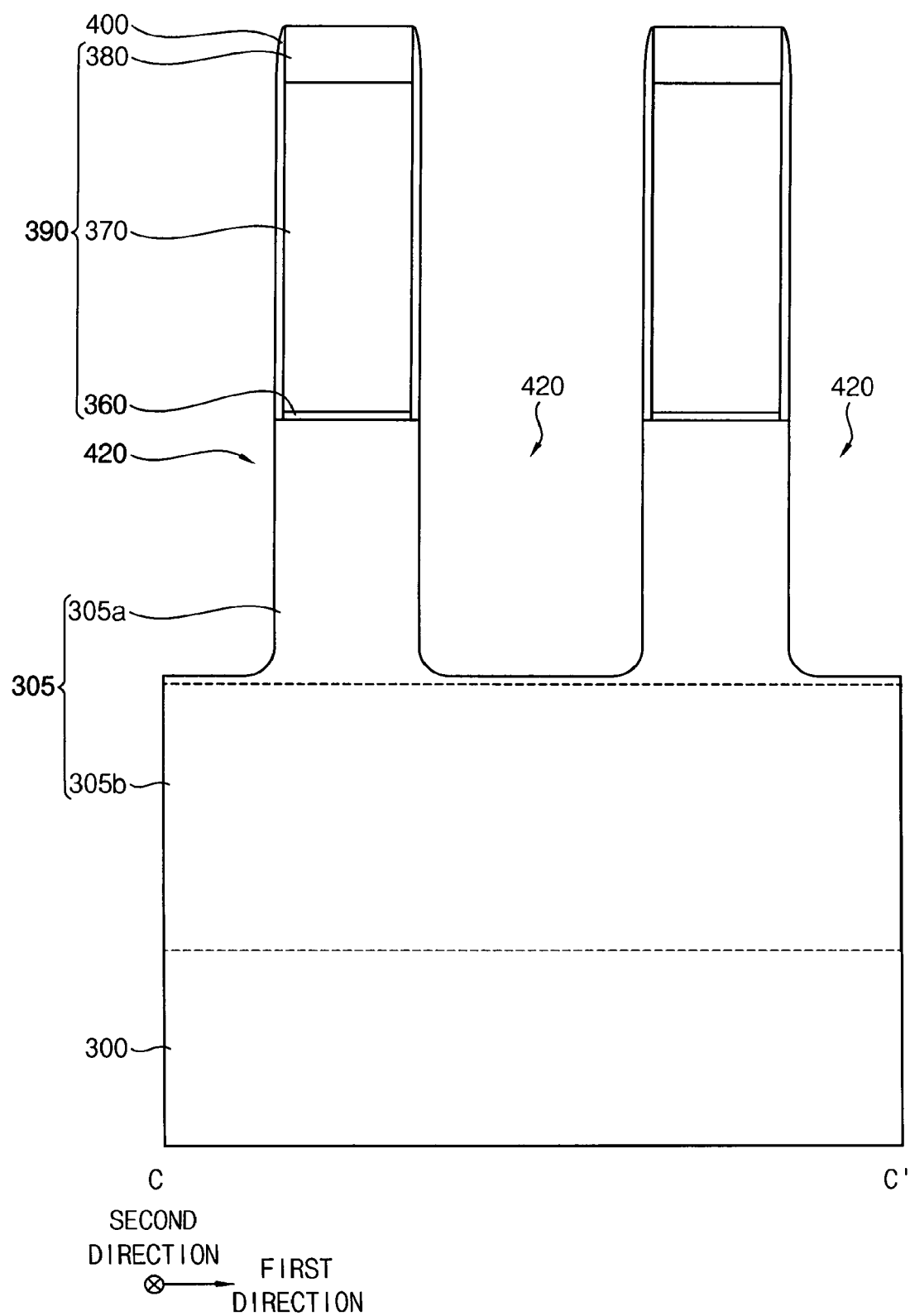

Referring to FIG. 24, a spacer layer covering the dummy gate structure 390 may be formed on the active fin 305 and the isolation structure 345, and the spacer layer may be anisotropically etched to form a gate spacer 400 on each of opposite sidewalls of the dummy gate structure 390 in the first direction. In this case, a fin spacer (not illustrated) may be formed on each of opposite sidewalls of the upper active pattern 305a in the second direction.

The spacer layer may include a nitride, e.g., silicon nitride. In one embodiment, the spacer layer may have a stacked structure including a nitride layer and an oxide layer.

An upper portion of the active fin 305 adjacent to the gate spacer 400 may be etched to form a second recess 420.

The figures illustrate that a lower surface of the second recess 420 is higher than an upper surface of the lower active pattern 305b. The inventive concept is not be limited thereto. For example, the lower surface of the second recess 420 may be lower than a height of an upper surface of a portion of the lower active pattern 305b on which no second recess 420 is formed.

Figure 25:
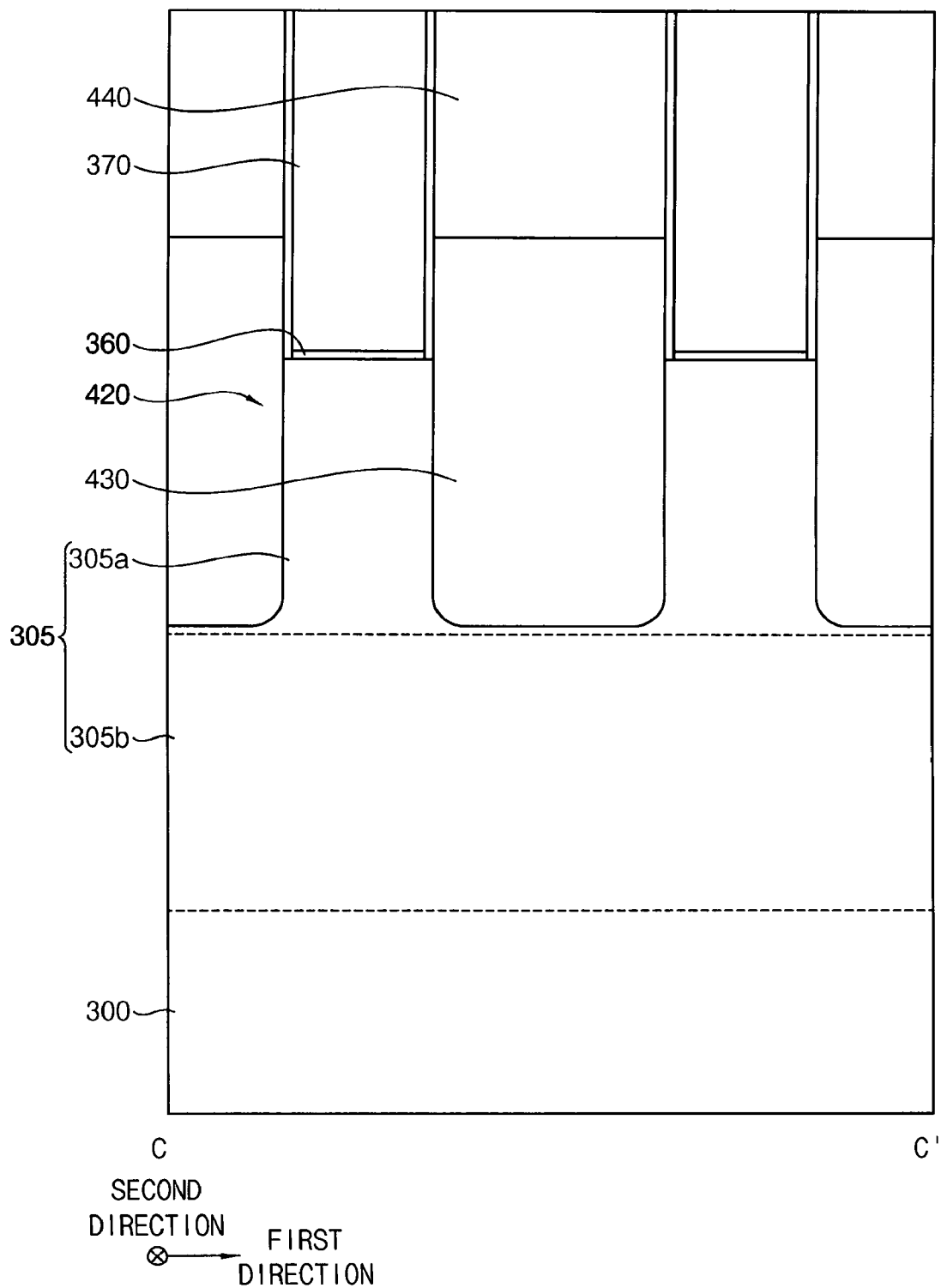

Referring to FIG. 25, a source/drain layer 430 filling the second recess 420 may be formed.

In example embodiments, the source/drain layer 430 may be formed by performing a selective epitaxial growth (SEG) process using the upper surface of the active fin 305 exposed by the second recess 420 as a seed layer.

In example embodiments, the SEG process may be performed using a silicon source gas, a germanium source gas, an etch gas and a carrier gas, and thus a single crystalline silicon-germanium layer as the source/drain layer 430 may be formed. The SEG process may also be performed using a P-type impurity source gas, and thus a single crystalline silicon-germanium layer doped with P-type impurities as the source/drain layer 430 may be formed.

The source/drain layer 430 may have a shape of which a cross-section taken along the second direction may be similar to a pentagon.

After forming an insulating interlayer 440 having a thickness enough to cover the dummy gate structure 390, the gate spacer 400, the fin spacer and the source/drain layer 430 and fill a space defined by the dummy gate structure 390 and the source/drain layer 430, the insulating interlayer 440 may be planarized until an upper surface of the dummy gate electrode 370 may be exposed. During the planarization process, the dummy gate mask 380 may also be removed together with the insulating interlayer 440.

Figure 26:
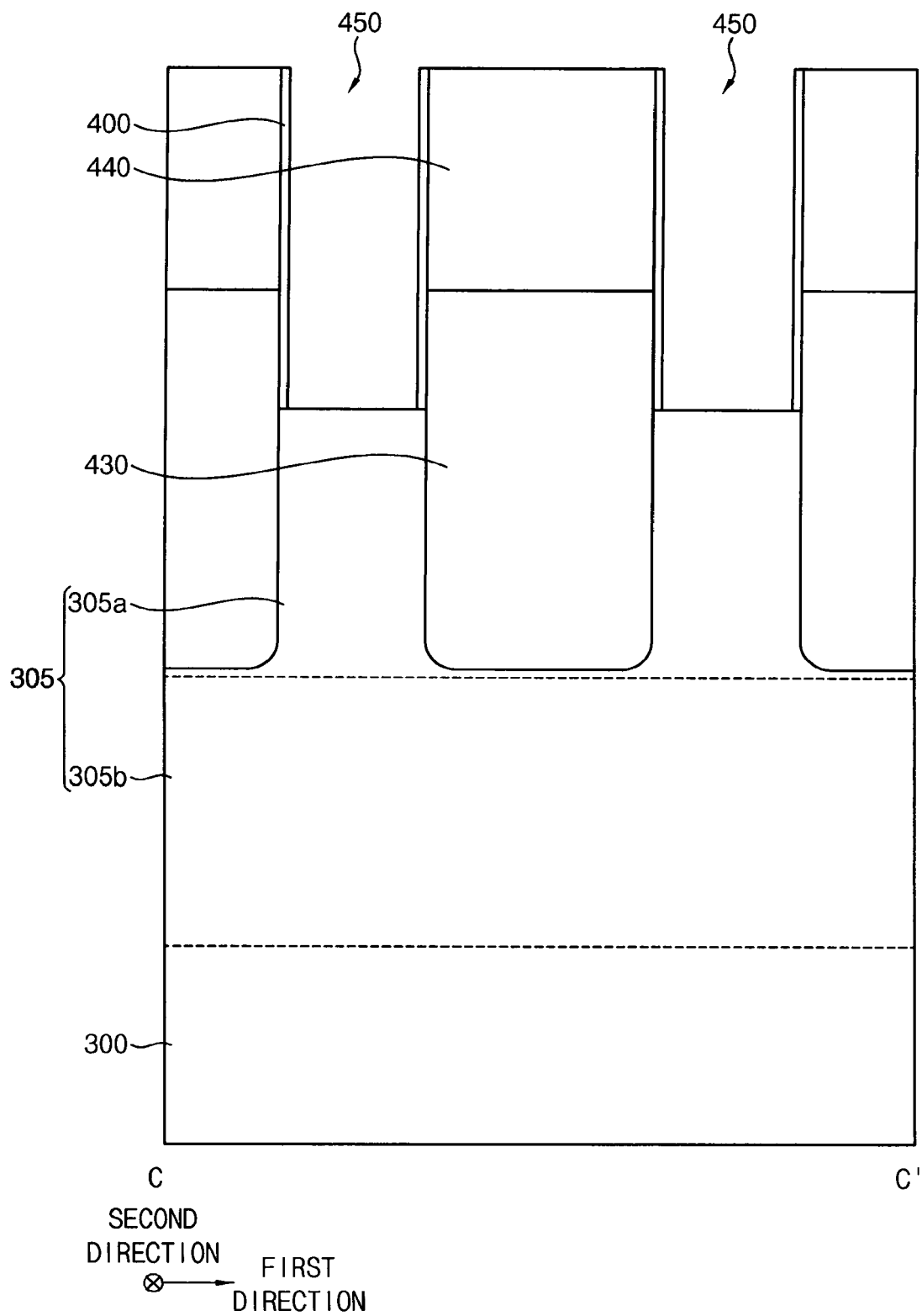

Referring to FIG. 26, the exposed dummy gate electrode 370 and the dummy gate insulation pattern 360 thereunder may be removed to form a first opening 450 exposing an inner sidewall of the gate spacer 400 and the upper surface of the active fin 305. In example embodiments, the dummy gate electrode 370 and the dummy gate insulation pattern 360 thereunder may be removed by the dry cleaning method in FIG. 14.

For example, the semiconductor substrate 300 may be loaded into the chamber 20 of the dry cleaning apparatus in FIG. 1 or FIG. 7, and a dry cleaning gas may be supplied onto the semiconductor substrate 300. Then, plasma may be generated from the dry cleaning gas within the chamber 20, and the dry cleaning gas plasma may react with dummy gate electrode 370 and the dummy gate insulation pattern 360 on the semiconductor substrate 300 to the chemical material.

Then, a laser light may be irradiated on a surface of the semiconductor substrate 300 to heat the semiconductor substrate 300 to thereby remove the chemical material by forming a gaseous cleaning process by-product. The present inventive concept is not limited thereto. For example, the laser light may be irradiated in-situ on the semiconductor substrate 300 during a time when being subject to the dry cleaning gas plasma reacting with the residual material.

The laser irradiator 100 may irradiate the laser light L on a whole surface of the semiconductor substrate 300 through the optical window 50. The laser light L passing through an aspheric lens 130 may be irradiated with uniform intensity across the whole surface of the semiconductor substrate 300 through the optical window 50.

By radiation heat transfer of the laser, the surface temperature of the semiconductor substrate 300 may be increased to a sublimation temperature of the cleaning process by-product, and thus the cleaning process by-product may be transitioned into a gaseous cleaning process by-product. The gaseous cleaning process by-product may be discharged through an exhaust port 24 from the chamber 20.

Figure 27:
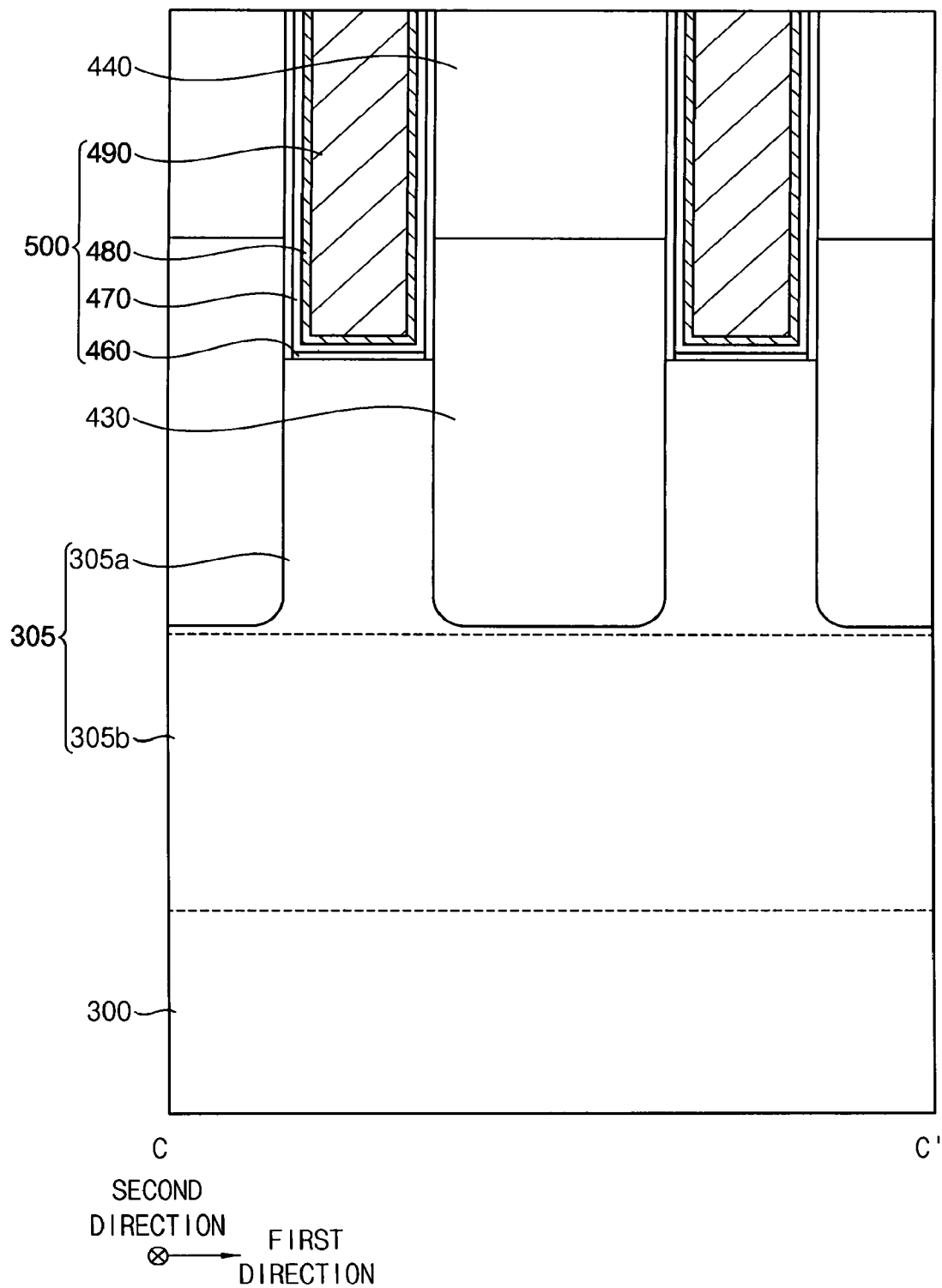

Referring to FIG. 27, a gate electrode structure 500 filling the first opening 450 may be formed.

Specifically, a thermal oxidation process may be performed on the upper surface of the active fin 305 exposed by the first opening 450 to form an interface pattern 460. A gate insulation layer and a work function control layer may be sequentially formed on the interface pattern 460, the isolation structure 345, the gate spacer 400 and the insulating interlayer 440. A gate electrode layer may be formed on the work function control layer to fill a remaining portion of the first opening 450.

The gate electrode layer, the work function layer and the gate insulation layer may be planarized until an upper surface of the insulating interlayer 440 may be exposed to form a gate insulation pattern 470, a work function control pattern 480 and a gate electrode 490. For example, the gate insulation pattern 470 and the work function control pattern 480 may be sequentially stacked on an upper surface of the interface pattern 460, the upper surface of the isolation structure 345 and the inner sidewall of the gate spacer 400, and the gate electrode 490 filling a remaining portion of the first opening 450 may be formed on the work function control pattern 480.

Then, after removing upper portions of the gate electrode structure 500 and the gate spacer 400 to form a third recess, a capping pattern (not illustrated) filling the third recess may be formed. A contact plug, a via and a wiring electrically connected to the source/drain layer 430 and/or the gate electrode structure 500 may be formed to complete the fabrication of the semiconductor device.

FIGS. 28 to 34 are cross-sectional views illustrating a method of manufacturing a semiconductor device in accordance with example embodiments. For example, FIGS. 28 to 34 may illustrate a method of manufacturing a non-volatile semiconductor device having a 3-dimensional structure or a vertical type memory device including a vertical channel.

In FIGS. 28 to 34, a direction vertically extending from an upper surface of a substrate may be defined as a first direction. Furthermore, two directions that are parallel with the upper surface of the substrate and cross each other may be defined as a second direction and a third direction, respectively. For example, the second direction and third direction may cross each other perpendicularly.

Figure 28:
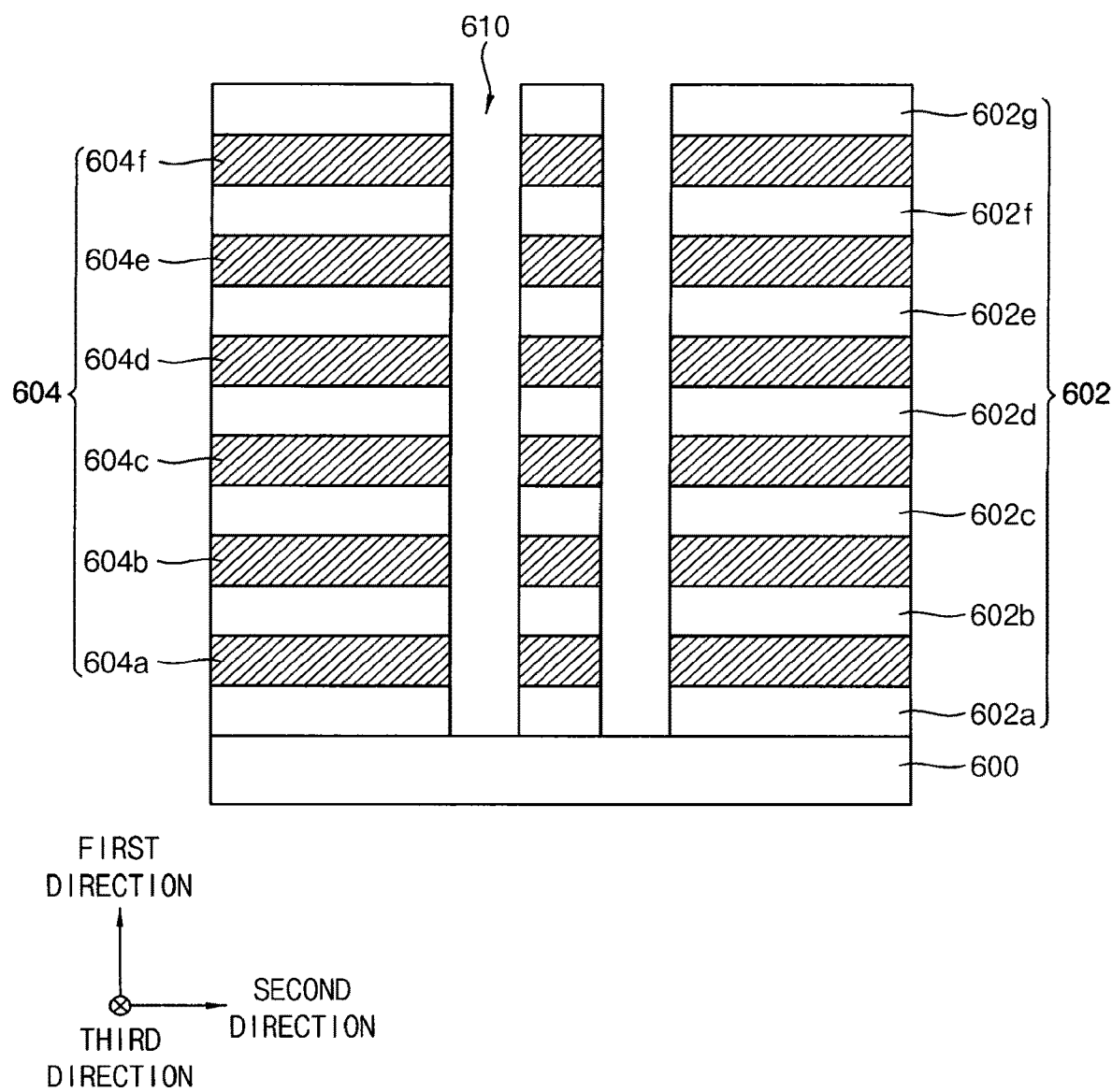

Referring to FIG. 28, interlayer insulation layers 602 (e.g., 602a through 602g) and sacrificial layers 604 (e.g., 604a through 604f) may be alternately and repeatedly formed on a substrate 600 to form a mold structure. Thereafter, the mold structure may be partially etched to form channel holes 610 exposing an upper surface of the substrate 600.

For example, the interlayer insulation layers 602 may include silicon oxide. The sacrificial layers 604 may include a material that may have an etch selectivity with respect to the interlayer insulation layers 602 and may be easily removed through a wet etch process. For example, the sacrificial layer 604 may include silicon nitride.

The sacrificial layers 604 may be removed in a subsequent process to provide spaces for a ground selection line (GSL), a word line and a string selection line (SSL). Thus, the number of the interlayer insulation layers 602 and the sacrificial layers 604 may be determined in consideration of the number of the GSL, the word line and the SSL.

For example, the mold structure may be partially removed through a dry etch process to form the channel holes 610. Each of the channel holes 610 may be trenches extended along the third direction. Additionally, the channel holes 610 may be arranged and spaced apart from each other along the second direction.

Figure 29:
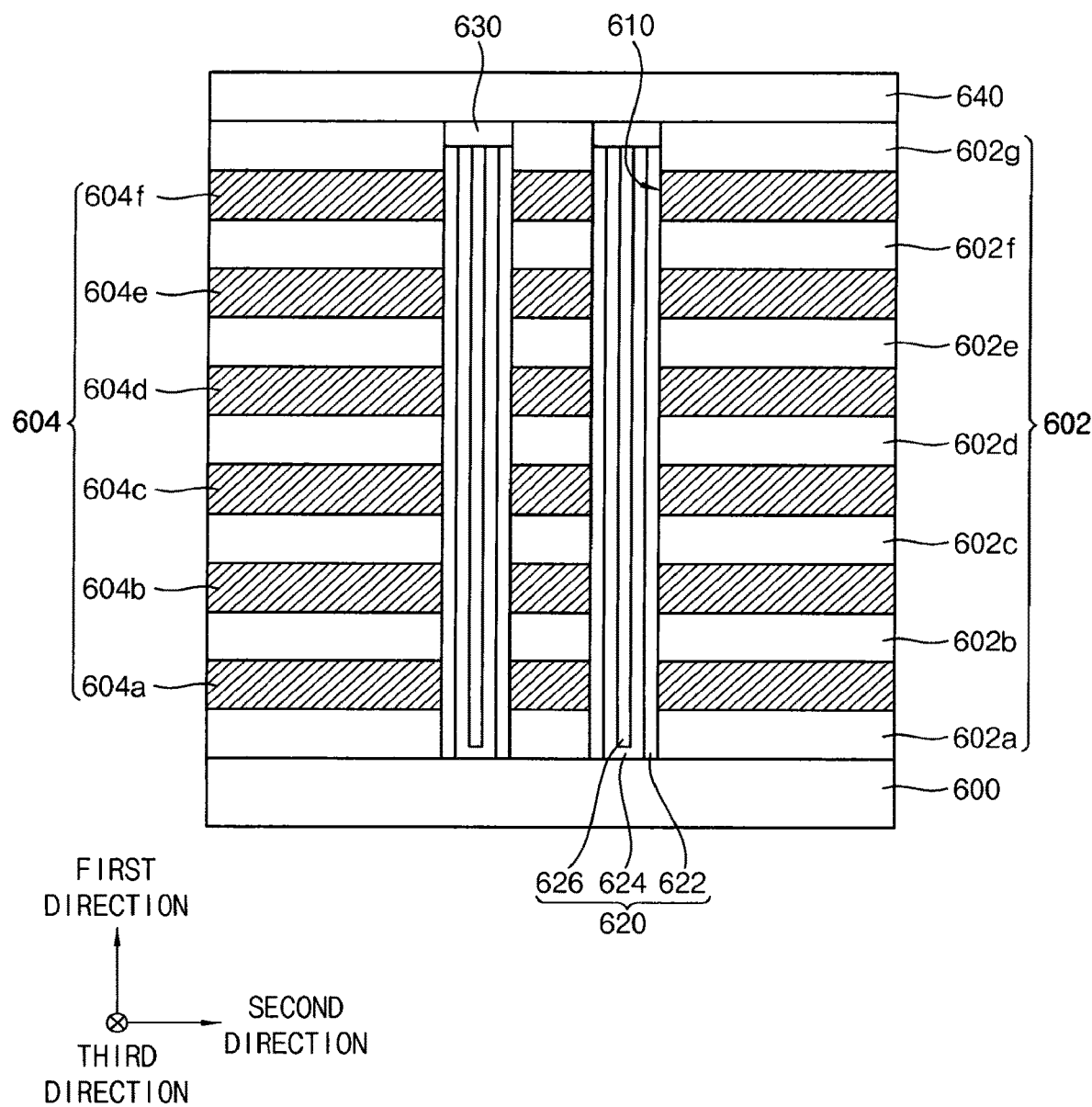

Referring to FIG. 29, a vertical channel structure 620 including a dielectric layer structure 622, a channel 624 and a filling pattern 626 may be formed in each of the channel holes 610. A capping pad 630 may be formed on the vertical channel structure 620.

For example, a dielectric layer may be formed along a sidewall and a bottom surface of each of the channel holes 610 and an upper surface of the uppermost interlayer insulation layer 602g. For example, a blocking layer, a charge trap layer and a tunnel insulation layer may be sequentially formed to obtain the dielectric layer.

For example, upper and lower portions of the dielectric layer may be removed through an etch-back process. Thus, portions of the dielectric layer formed on the upper surfaces of the uppermost interlayer insulation layer 602g and the substrate 600 may be substantially removed to form the dielectric layer structure 622. For example, the dielectric layer structure 622 may be formed at the sidewall of each of the channel hole 610, and may have a substantially straw shape or a substantially cylindrical shell shape.

Thereafter, a channel layer may be formed on surfaces of the uppermost interlayer insulation layer 602g and the dielectric layer structures 622, and the upper surface of the substrate 600. A filling layer may be formed on the channel layer to fill remaining portions of each of the channel holes 610.

The filling layer and the channel layer may be planarized, for example, through a chemical-mechanical-planarization (CMP) process and/or an etch-back process until the uppermost interlayer insulation layer 602g is exposed. Accordingly, the channel 624 and the filling pattern 626 sequentially stacked from an inner wall of the dielectric layer structure 622 may be formed to fill each of the channel holes 610.

A capping pad 630 capping an upper portion of each of the channel holes 610 may be further formed on the vertical channel structure 620. A first upper insulation layer 640 may be formed on the uppermost interlayer insulation layer 602g to cover the capping pads 630.

Figure 30:
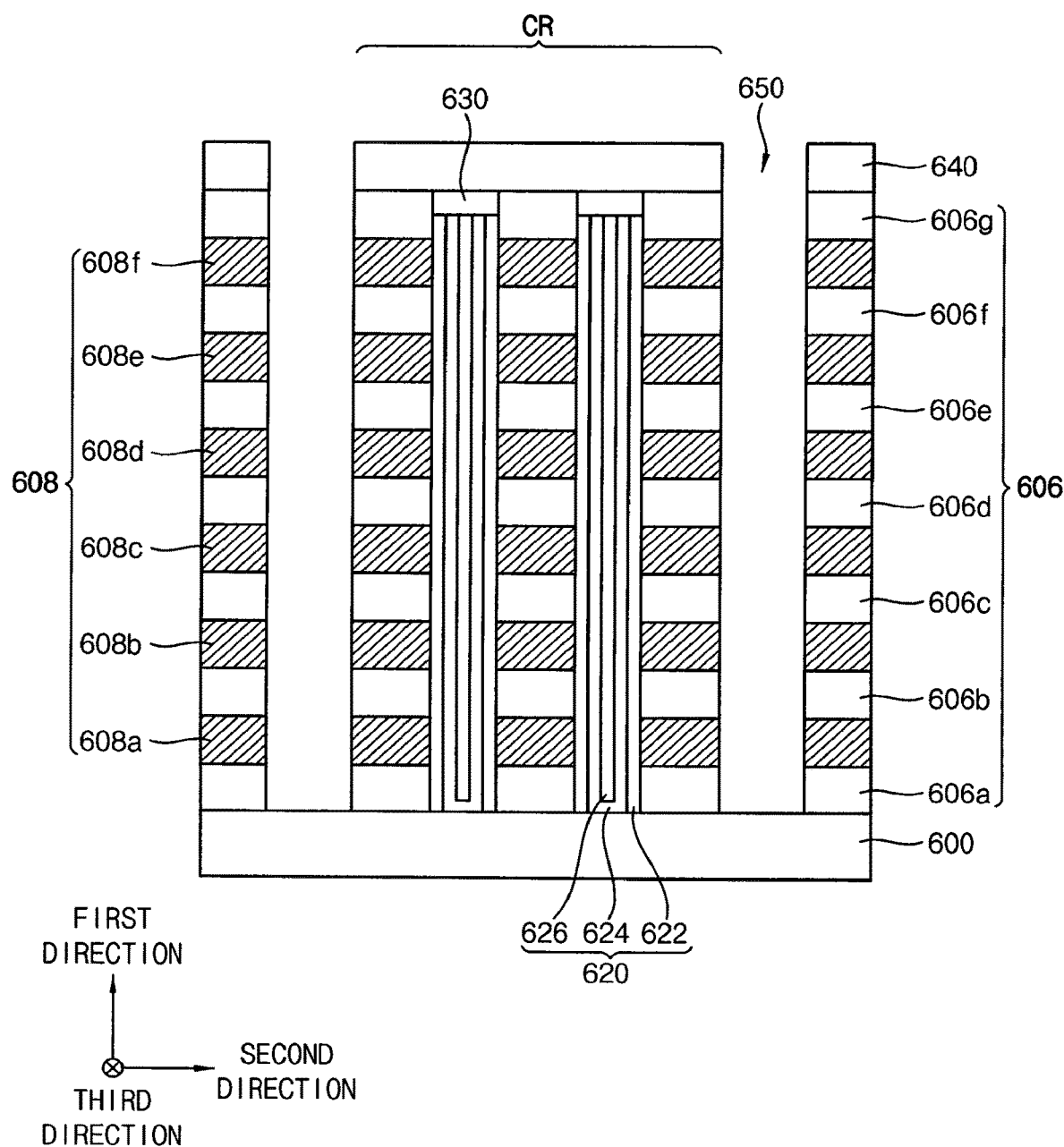

Referring to FIG. 30, the first upper insulation layer 640 and the mold structure may be partially etched to form channel rows CR and an opening 650. The opening 650 may be disposed between two adjacent channel rows CR. For example, portions of the first upper insulation layer 640 and the mold structure may be etched through a dry etch process to form the opening 650 and the channel rows CR.

As the openings 650 are formed, the interlayer insulation layers 602 and the sacrificial layers 604 may be changed into interlayer insulation patterns 606 (e.g., 606a through 606g) and sacrificial patterns 608 (e.g., 608a through 608f). The interlayer insulation patterns 606 and the sacrificial patterns 608 at each level may have a plate shape surrounding the vertical channel structures 620 included in the channel rows CR and extending in a direction.

Figure 31:
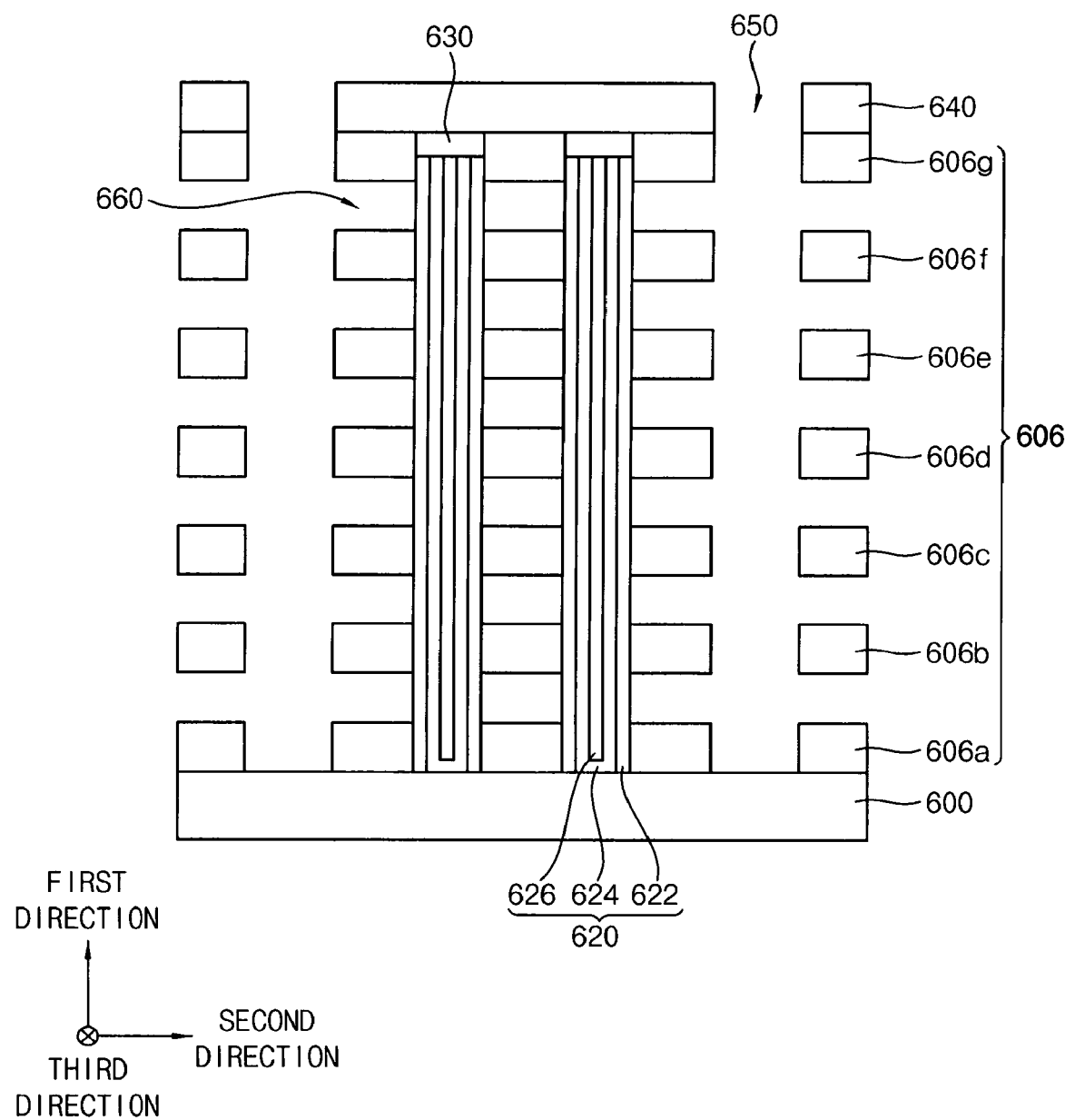

Referring to FIG. 31, the sacrificial patterns 608, of which the sidewalls are exposed by the opening 650, may be removed.

In example embodiments, the sacrificial patterns 608 may be removed to form a gap 660 by a wet etch process in which a residual material may be left on the interlayer insulation patterns 606 and the vertical channel structures 620 exposed by the gap 660 as discussed with reference to FIG. 15. In example embodiments, the residual material on the interlayer insulation patterns 606 and the vertical channel structures 620 may be removed by the dry cleaning method in FIG. 14.

For example, the substrate 600, after the wet etch process to form the gap 660, may be loaded into a chamber 20 of the dry cleaning apparatus in FIG. 1 or FIG. 7, and a dry cleaning gas may be supplied onto the substrate 600. Then, plasma may be generated within the chamber 20 from the dry cleaning gas, and the dry cleaning gas plasma may react with the residual material on the sidewalls of the sacrificial patterns 608 exposed by the gap 660 to form a chemical material as discussed with reference to FIG. 16.

Then, the laser light L may be irradiated on a surface of the substrate 600 to heat the substrate 600 to thereby remove the chemical material by forming a gaseous cleaning process by-product. The present inventive concept is not limited this order of steps. For example, the laser light L may be irradiated on the surface of the substrate 600 during a time when the dry cleaning gas plasma reacts with the residual material on the sacrificial patterns 608.

The laser irradiator 100 may irradiate the laser light L on a whole surface of the substrate 600 through the optical window 50. The laser light L passing through the aspheric lens 130 may be irradiated with uniform intensity across the whole surface of the substrate 600 through the optical window 50.

By radiation heat transfer of the laser, the surface temperature of the substrate 600 may be increased to a sublimation temperature of the chemical material, and thus the chemical material may be transitioned into a gaseous cleaning process by-product. The gaseous cleaning process by-product may be discharged through an exhaust port 24 from the chamber 20.

The gap 660 may be defined by a space from which the sacrificial patterns 608 are removed. A plurality of the gaps 660 may be formed between the adjacent interlayer insulation patterns 606. An outer sidewall of the dielectric layer structure 622 may be exposed by the gaps 660.

Figure 32:
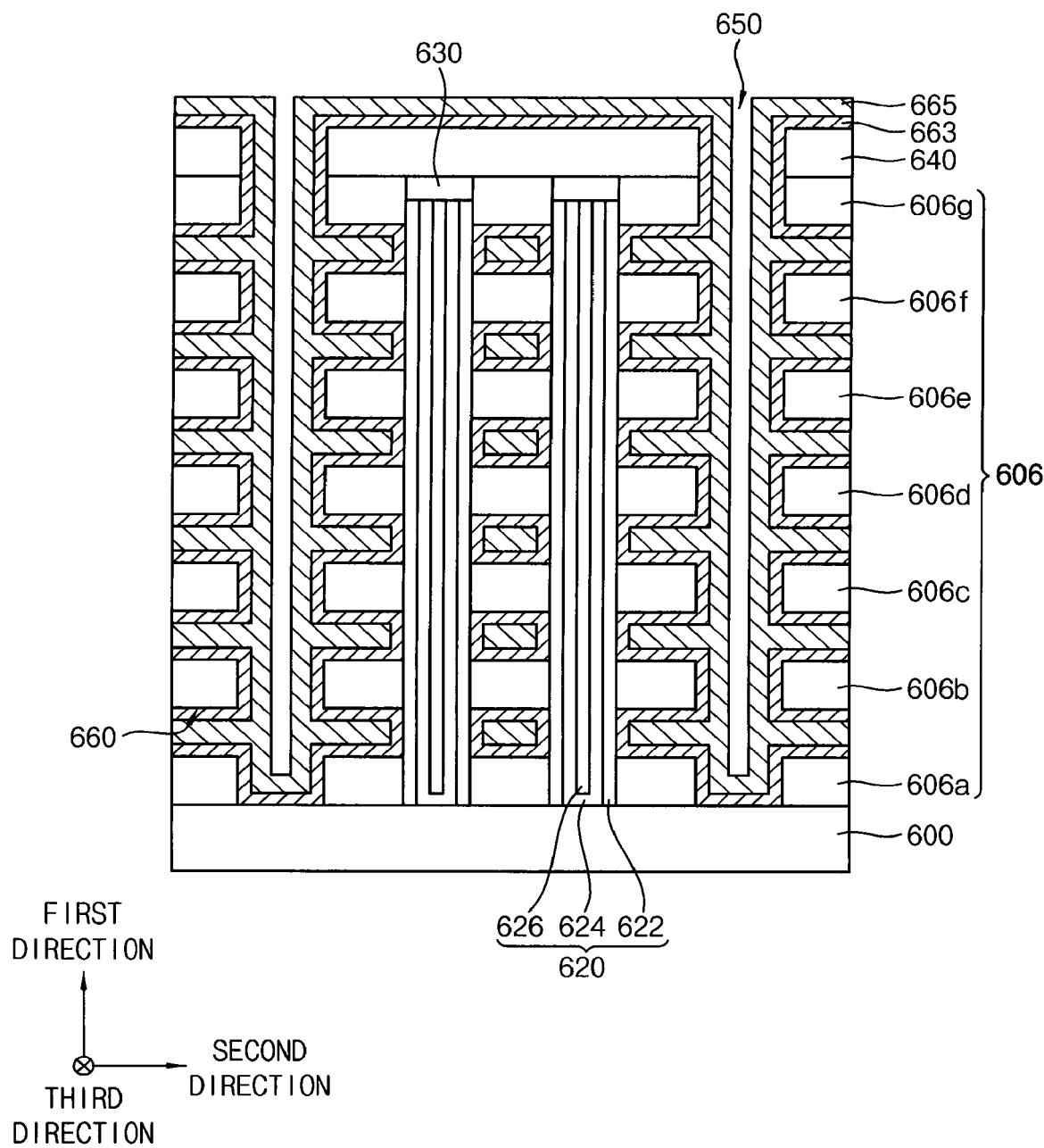

Referring to FIG. 32, a barrier conductive layer 663 may be formed along the exposed outer sidewall of the dielectric layer structure 622, an inner wall of the gap 660, a surface of the interlayer insulation pattern 606, and the exposed upper surface of the substrate 600. A metal gate layer 665 may be formed on the barrier conductive layer 663. In an exemplary embodiment, the metal gate layer 665 may sufficiently fill the gap 660, and may at least partially fill the opening 650.

Figure 33:
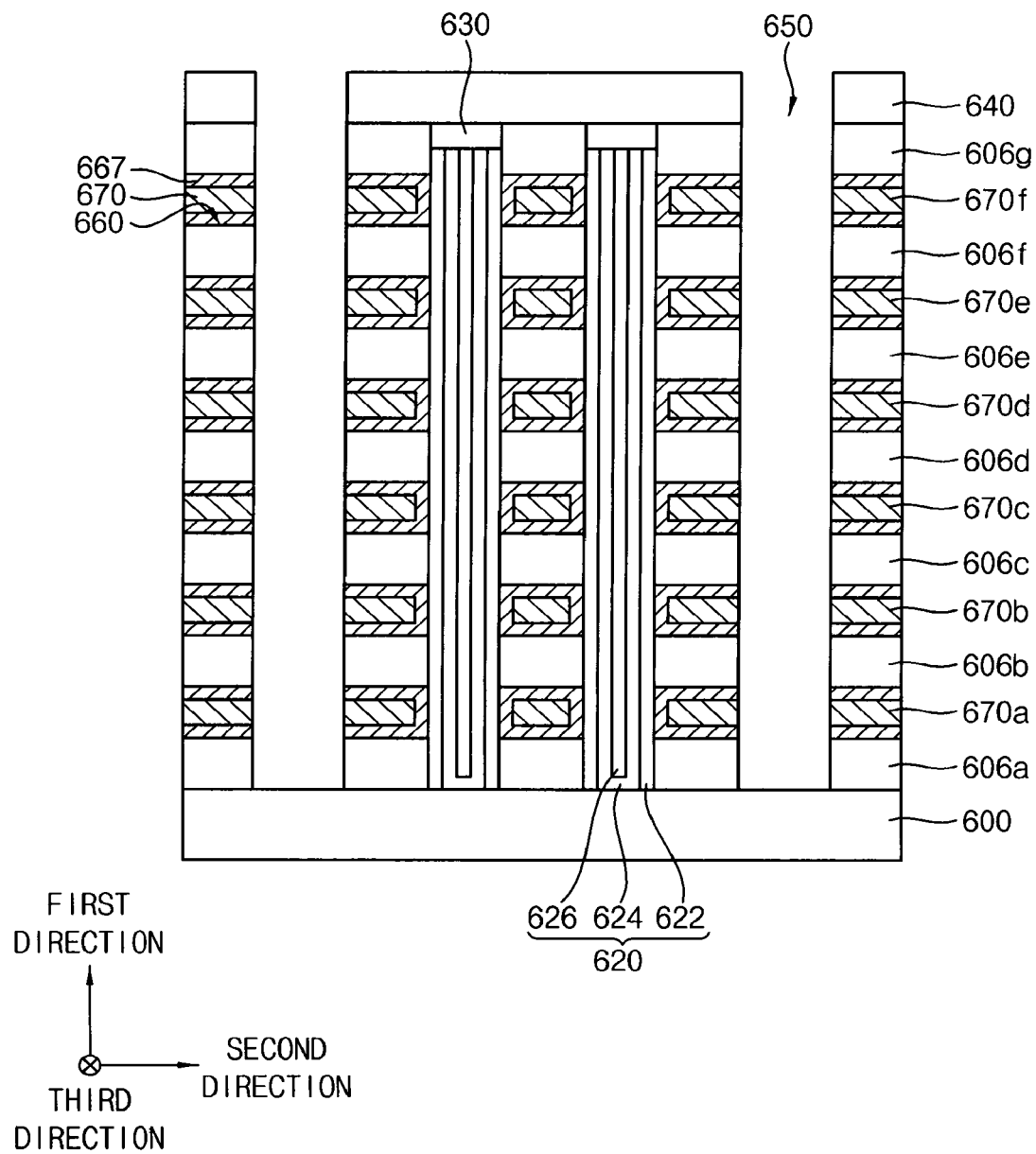

Referring to FIG. 33, the barrier conductive layer 663 and the metal gate layer 665 may be partially etched to form a barrier conducive pattern 667 and a metal gate 670 (e.g., 670a through 670f) in each of the gaps 660. The metal gate 670 may have a linear shape or a plate shape, which surrounds sidewalls of the vertical channel structures 620 included in the channel rows CR and extending in direction.

Figure 34:
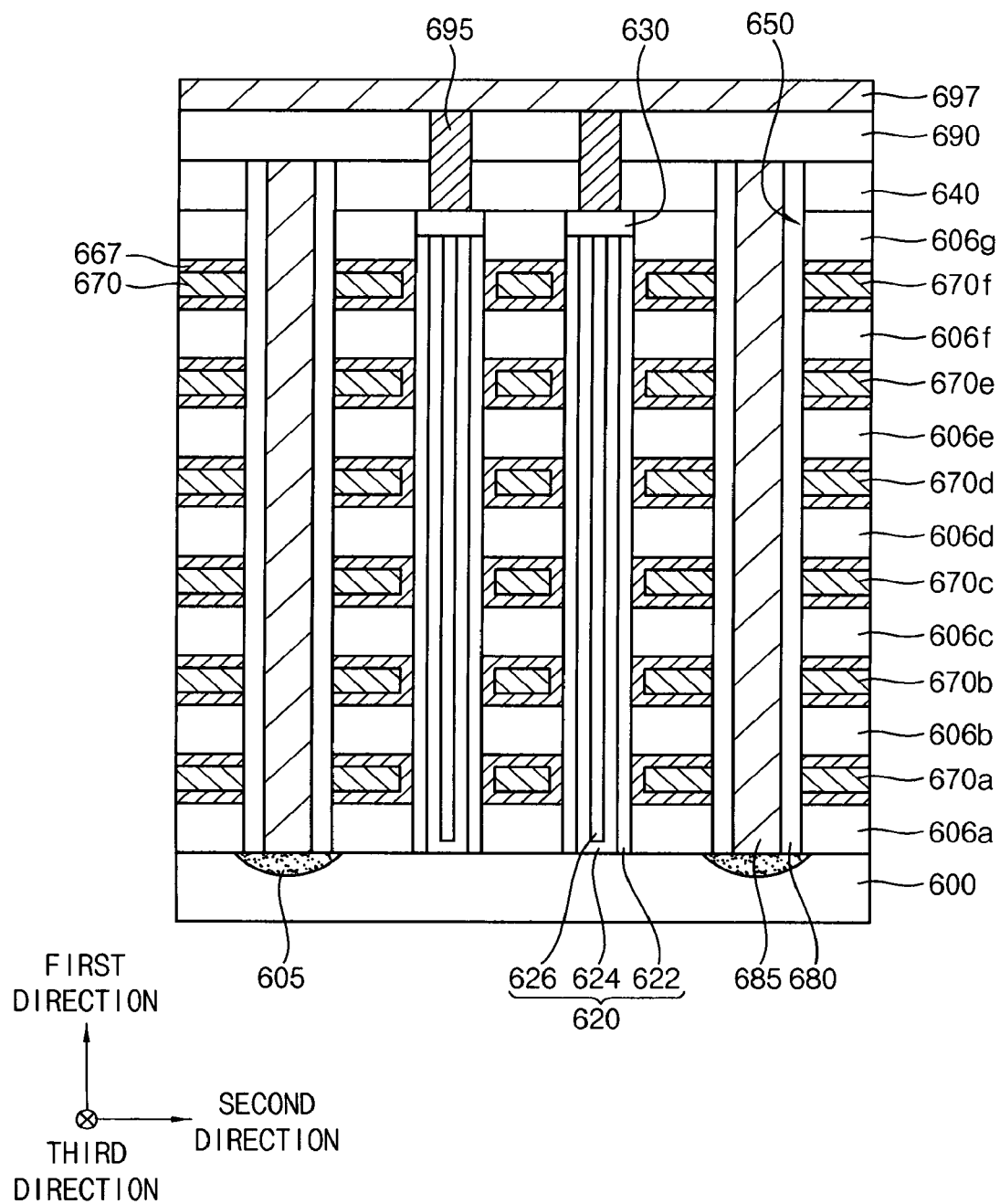

Referring to FIG. 34, an impurity region 605 may be formed on the substrate 600 exposed by the opening 650, and a spacer 680 and a cutting pattern 685 may be formed in the opening 650.

A second upper insulation layer 690 may be formed on the first upper insulation layer 640 to cover the cutting pattern 685 and the spacer 680.

Thereafter, a bit line contact 695 may be formed. The bit line contact 695 may pass through the first and second upper insulation layers 640 and 690 to contact the capping pad 630. Thereafter, a bit line 697 electrically connected to the bit line contact 695 may be formed on the second upper insulation layer 690.

The above dry cleaning apparatus and method may be used to manufacture semiconductor devices including logic devices and memory devices. For example, the semiconductor device may be applied to various systems such as a computing system. The semiconductor device may include finFETs (fin field effect transistors), DRAMs (dynamic random access memories), VNANDs (vertical NANDs), etc. The system may be applied to a computer, a portable computer, a laptop computer, a personal portable terminal, a tablet, a cell phone, a digital music player, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A dry cleaning method, comprising:
    loading a substrate into a chamber;
    supplying a dry cleaning gas into the chamber through a shower head;

generating plasma from the dry cleaning gas;

forming a cleaning process by-product by reacting the plasma with an etch residue on the substrate; and irradiating a laser light on a surface of the substrate to heat the substrate, thereby transitioning the cleaning process by-product to a gaseous cleaning process by-product.

2. The dry cleaning method of claim 1, wherein the irradiating of the laser light on the surface of the substrate comprises:

irradiating the laser light on the surface of the substrate through an optical window in an upper wall of the chamber.

3. The dry cleaning method of claim 2, wherein the optical window penetrates through a middle region of the shower head.

4. The dry cleaning method of claim 1, wherein the irradiating of the laser light on the surface of the substrate comprises:
  generating the laser light;
    passing the laser light through an aspheric lens to spread radially the laser light; and
    projecting the laser light passing through the aspheric lens on a whole surface of the substrate through an optical window penetrating through the shower head.

5. The dry cleaning method of claim 4, wherein the irradiating of the laser light on the surface of the substrate further comprises:

selectively transmitting the laser light passing through the aspheric lens through an optical mask.

6. The dry cleaning method of claim 1, wherein the generating of the plasma from the dry cleaning gas and the irradiating of the laser light on the surface of the substrate are performed at the same time.

7. The dry cleaning method of claim 1, further comprising:

performing an etch process on the substrate, wherein the etch residue is formed on the substrate before the supplying of the dry cleaning gas is performed.

* * * * *